United States Patent
Girard et al.

(10) Patent No.: US 7,127,799 B2
(45) Date of Patent: Oct. 31, 2006

(54) HEAD GIMBAL ASSEMBLY METHOD

(75) Inventors: Mark T. Girard, South Haven, MN (US); Ryan A. Jurgenson, Hutchinson, MN (US); Roger R. Livermore, deceased, late of Hutchinson, MN (US); by Susan June Livermore, legal representative, Hutchinson, MN (US); David R. Swift, Glencoe, MN (US); Joseph P. Tracy, South Haven, MN (US)

(73) Assignee: Applied Kinetics, Inc., Hutchinson, MN (US)

(*) Notice: Subject to any disclaimer, the term of this patent is extended or adjusted under 35 U.S.C. 154(b) by 512 days.

(21) Appl. No.: 10/073,600

(22) Filed: Feb. 11, 2002

(65) Prior Publication Data

US 2002/0069510 A1 Jun. 13, 2002

Related U.S. Application Data

(63) Continuation of application No. 09/410,602, filed on Oct. 1, 1999, now abandoned.

(60) Provisional application No. 60/102,860, filed on Oct. 2, 1998, now abandoned.

(51) Int. Cl.
  *G11B 5/127* (2006.01)
  *H04R 31/00* (2006.01)

(52) U.S. Cl. .............. 29/603.1; 29/603.07; 29/603.12; 29/603.16; 29/851; 73/104; 73/105; 360/234.5; 360/235.8

(58) Field of Classification Search ............ 29/603.04, 29/603.05, 603.09, 593, 603.07, 603.1, 603.12, 29/603.16, 851; 360/234.5, 245.9, 245.8, 360/245, 235.8; 73/104, 105
See application file for complete search history.

(56) References Cited

U.S. PATENT DOCUMENTS

| | | | |
|---|---|---|---|
| 4,866,836 A | 9/1989 | Von Brandt et al. .......... 29/603 |
| 5,198,945 A | 3/1993 | Blaeser et al. .............. 360/104 |
| 5,198,948 A | 3/1993 | Stover et al. ............... 360/124 |
| 5,201,458 A * | 4/1993 | Hagen ........................ 228/199 |
| 5,282,102 A | 1/1994 | Christianson ............... 260/104 |
| 5,371,939 A | 12/1994 | Ressmeyer et al. ........... 29/603 |
| 5,391,842 A | 2/1995 | Bennin et al. .............. 174/260 |
| 5,473,488 A | 12/1995 | Gustafson et al. .......... 360/104 |
| 5,491,597 A | 2/1996 | Bennin et al. ............. 360/104 |
| 5,588,200 A * | 12/1996 | Schudel ................... 29/603.01 |
| 5,608,590 A | 3/1997 | Ziegler et al. ............. 360/104 |

(Continued)

FOREIGN PATENT DOCUMENTS

JP  07169217 A  * 7/1995

OTHER PUBLICATIONS

"ESD-sensitivity study of GMR recording heads with a flex-on-suspension head-gimbal assembly"; Lam, C.F.; Martinez, D.; Chang, C.;Electrical Overstress/Electrostatic Discharge Symposium; Sep. 28-30, 1999; pp. 391-404.*

*Primary Examiner*—Paul D. Kim
(74) *Attorney, Agent, or Firm*—Kagan Binder, PLLC

(57) ABSTRACT

The present invention provides a method for assembling a head gimbal assembly useful in a hard disk drive and for testing such an assembly. In a method in accord with the present invention a head/slider is mounted to a circuited gimbal in an automated assembly machine. Following this step the head/slider circuited gimbal assembly will be subjected a dynamic electrical test with those head/slider circuited gimbal assemblies not passing being sorted from the lot. Following this step the head/slider circuited assembly will be attached to a suspension.

12 Claims, 20 Drawing Sheets

U.S. PATENT DOCUMENTS

| | | |
|---|---|---|
| 5,636,089 A | 6/1997 | Jurgenson et al. .......... 360/104 |
| 5,645,735 A | 7/1997 | Bennin et al. ................ 216/22 |
| 5,661,619 A | 8/1997 | Goss ........................ 360/104 |
| 5,682,780 A | 11/1997 | Girard ....................... 72/16.2 |
| 5,729,889 A | 3/1998 | Goss ....................... 29/603.06 |
| 5,812,344 A | 9/1998 | Balakrishnan .............. 360/104 |
| 5,859,749 A | 1/1999 | Zarouri et al. .............. 360/104 |
| 5,864,054 A * | 1/1999 | Smith, Jr. .................... 73/105 |
| 5,877,920 A | 3/1999 | Resh ......................... 360/104 |
| 5,896,247 A * | 4/1999 | Pan et al. ................. 360/234.5 |
| 5,901,016 A * | 5/1999 | Iwamoto .................. 360/245.9 |
| 5,912,787 A | 6/1999 | Khan et al. ................. 360/104 |
| 6,007,664 A * | 12/1999 | Kuizenga et al. ........ 156/272.8 |
| 6,020,022 A | 2/2000 | Ejiri et al. .................. 427/128 |
| 6,046,887 A * | 4/2000 | Uozumi et al. .......... 360/245.9 |
| 6,130,863 A | 10/2000 | Wang et al. ................... 369/13 |
| 6,134,083 A * | 10/2000 | Warmka .................. 360/235.6 |
| 6,146,813 A | 11/2000 | Girard et al. ............... 430/319 |

\* cited by examiner

HEAD GIMBAL ASSEMBLY METHOD

This is a continuation of Application No. 09/410,602 filed Oct. 1, 1999 now abandoned.

The present application is a continuation of U.S. Provisional Patent Application Ser. No. 60/102,860, for Method for Manufacturing a Head Gimbal Assembly, filed Oct. 2, 1998, now abandoned the specification of which in incorporated herein in its entirety.

FIELD OF THE INVENTION

The present invention relates generally to assembly procedures used in the manufacture of hard disk drives and particularly to a method of assembling a head gimbal assembly and testing procedures used in evaluating the assembled component parts of the head gimbal assembly at various stages in the assembly process.

BACKGROUND OF THE PRESENT INVENTION

The hard disk drive is the principal device used for long term, bulk memory storage in today's computers. The hard disk drive includes a rotating disk and a head gimbal assembly that is attached to actuator arm in the disk drive and that is held thereby closely adjacent to the rotating disk. The head gimbal assembly consists of several distinct components including a suspension, a gimbal, a flex circuit, and a slider with its integral read/write head. The rotating disk is coated with a magnetic or read/write media that is selectively magnetized by a read/write head to store information thereon. In operation, an electric current is provided to the read/write head, which creates and applies a magnetic field to the disk as the disk rotates relative to the head. The current is selectively controlled such that the applied magnetic field selectively reverses, thereby preferentially magnetizing elective areas of the disk. Each magnetized area consists of a north and south pole selectively oriented in one of two preferred directions. Magnetized areas having a north pole pointing in one of the two direction are designated as a "0" and in the other direction as a "1." In this way the binary language of computers consisting of zeroes and ones is assembled and data and programs, which comprise zeroes and ones in binary computer language, are stored on the hard disk. To read the information, current read/write heads sense changes in the current flowing through the head as the magnetized areas of the disk pass by and recognizes the current changes as a 0 or 1.

Typical hard disk drives include multiple disks and multiple read/write heads. As the disks rotate in the disk drive, air flow from the spinning disks interacts with the bearing surface on the slider to create an air bearing, which is used to place the read/write head at the designed distance from the disk media, also known as the hard disk drive's magnetic spacing. If the head is too far away from the media, signal loss will occur and if the head is too close to the media, the head could mechanically crash, that is, actually come into contact with the disk, resulting in damage to the head or the media and often a complete hard drive failure.

Currently, the hard disk drive industry is striving to increase the amount of data or information that can be stored in a predetermined area. That is, the industry is trying to increase the quantity of information stored per unit area of the disk. To do this, the magnetized disk media areas, which are representative of the stored data, must be smaller and closer together. In turn, this requires that the sliders as well as the magnetic spacing be smaller. As the sliders are made smaller, they become increasingly sensitive to factors causing spacing variation. The key mechanical factors that determine the proper magnetic spacing are the bearing manufacturing tolerances, the load placed on the slider from the suspension, and the torque acting on the slider from the suspension and assembly tolerances.

The performance of the read/write head is critical to the long-term operation of a hard drive. These devices include small component parts operating under extreme conditions. Precision manufacturing and quality control testing of these parts prior to their incorporation into the finished hard disk drive is therefore desirable to ensure that only quality components make it into the disk drives before being sold to the consumer.

One of the critical components in the hard disk drive is the head gimbal assembly. The head gimbal assembly has traditionally been assembled together by hand in several steps. Presently, a head gimbal assembly process includes, broadly stated, steps including the adhesive attachment of a slider to a suspension, the routing of leads to electrically connect the head to the disk drive electronics, and the testing the electrical performance of the head while the suspension holds it over a test disk. Many problems are encountered with the present process resulting in high costs and poor magnetic spacing tolerances.

One of the problems is that the present system is labor intensive. This creates many potential opportunities for the generation of electrostatic charges, which can damage the components with an electrostatic discharge (ESD) or electrical overstress (EOS).

Another example of a problem relates to the electrical connection made between the head termination pads on the slider and the electrical interconnect or flex circuit running along the suspension after the slider is attached to the suspension. These electrical connections are difficult to make for several reasons. For example, the slider is positioned with respect to the gimbal load point and not necessarily the electrical leads on the suspension, which can cause the electrical connection to be difficult and unreliable. In addition, because the intricate surface features of the head/slider and suspension make it difficult to hold in a fixture, the bonding process, which requires a significant force to achieve a good bond, often leads to damage of the suspension.

After attachment of the slider to the suspension, each head is tested while the suspension holds the slider over a rotating testing disk. This test is known as a dynamic electrical test (DET). Current DET test procedures require that the head gimbal assembly be held in the loaded position at the correct magnetic spacing or Z-height with respect to the spinning testing disk, making both loading the assembly and automating this test difficult. In addition, mechanical and head tolerances can cause a poor signal, making it difficult to discern the source of any poor performance. Further, the DET results indicate that a head is bad and must be discarded, then the manufacturer must throw away not only the head/slider but also the suspension to which it is bonded. This is a source for significant yield cost.

Static angles are currently measured with the suspension clamped and held in its loaded state, by lifting the beam with a pin near its center. While the slider bond pad is the point of interest, it is impossible to load it and measure it at the same time, without affecting the static angle. The act of bringing the suspension to its loaded position causes clamping and fixturing to be difficult as well as forces one to account for a pitch bias, because the loading is not at the suspension bond pad. In addition, if the loading mechanism is not perfectly centered on the load beam, the act of loading can cause a roll bias in the angle measurement.

In the past, some have measured static angles in the unloaded condition, but the measurement reference was the plane of the suspension beam and not the mounting plate plane (actuator arm interface). This reference problem resulted in an unpredictable bias between the measured static angles and the real static angles.

Placing the read/write slider on the suspension is primarily a manually process wherein pins or cavities in tooling hold each component in alignment. While the position target is to align the suspension load point to the designed location on the slider air bearing, tolerances make this a difficult task. U.S. Pat. No. 4,866,836 addresses these tolerances by optically aligning the slider body to the suspension (dimple) load point. This technique alleviates the load point source of torque variation, but it does not address the torque from suspension, circuit, bond line parallelism and slider parallelism tolerances.

Several techniques have been attempted to "bond out" the static angles from the suspension and slider (parallelism). These are described in U.S. Pat. Nos. 5,608,590; 5,473,488; 5,661,619; 5,729,889 and 5,636,089. These concepts attempt to counter torque from static angle tolerances by allowing the adhesive to form a wedge between the slider and suspension bonding surfaces. These techniques do not address torque from load point tolerances and the adhesive wedge is difficult to control, at best, thus it does not "bond out" the static angle tolerances.

U.S. Pat. Nos. 5,198,945 and 5,282,102 teach integrated flexure suspensions that reduce some load position errors, but do not address torque from static angle tolerance, bond line parallelism or slider parallelism.

U.S. Pat. No. 5,682,780 is an example of a suspension adjustment technology used to decrease some of the static angle variation from the suspension components, which involves deforming the mechanical suspension. It does not address load point, bond line parallelism or slider parallelism sources of torque.

A technique has been used to measure the torque acting on the slider body and shift the slider relative to the suspension to minimize the torque during slider bonding. This technique is shown in U.S. Pat. No. 5,371,939. While this technique adjusts slider position to account for torque from static angles, load point, and slider parallelism, it requires aligning the slider with the suspension in a loaded position and requires that small actuated fixtures come in contact with the slider body. Bringing the suspension to the loaded position involves precise clamping and very controlled distances between that clamp surface and the loading surface. Thus, inherently, this technique is difficult to automate and achieve high throughput.

The foregoing discussion of current head gimbal assembly procedures has highlighted several of the problems with the current assembly procedures and pointed out the long-felt but unsatisfied needs of the industry. Thus, there is a need for a method of only aligning the head termination pads to the interconnect leads rather than the gimbal load point as well as a need for simplifying the fixturing to reduce damage to the suspension. Also, there is a need for a fast, automatable method for performing a dynamic electrical head test before the head is mounted to a suspension. Yet again, there is a need for a fast, automatable method of mounting a slider without the use of complicated tools and applying a load, which does not damage the suspension and accounts for static angle torques. Additionally, there is a need for a fast, automatable static angle measurement system that does not require loading the suspension, but uses a predictable and functional reference surface. Finally, there is a need for a fast, automatable method to align and attach a slider to a suspension, while accounting for all sources of torque variation.

SUMMARY OF THE INVENTION

It is an object of the present invention to provide new and improved apparatus that is not subject to the foregoing disadvantages.

It is another object of the present invention to provide a method for attaching a head/slider to a circuited gimbal with one or more of the following advantages: without damaging the suspension; with improved alignment between the termination pads of the head/slider and the circuited gimbal; with simplified tooling; or with simplified tooling and improved substrate heating and control.

It is still yet another object of the present invention to provide a method for a dynamic electrical test of the read/write head without the suspension present with low cost and high throughput, thereby obviating the need to throw away a good suspension when a given head is found to be rejectable under DET test criteria.

It is still a further object of the present invention to attach a head/slider/circuited gimbal to a suspension and compensate for torque from suspension, circuited gimbal, bond line, and slider parallelism static angles, as well as load point.

It is another object of the present invention to reduce operator handling and other sources of ESD or EOS, which could otherwise damage the head element.

The present invention provides a method for assembling a head gimbal assembly useful in a hard disk drive and for testing such an assembly. In a method in accord with the present invention a head slider is mounted to a circuited gimbal in an automated assembly machine using an adhesive dispenser to dispense adhesive on a circuited gimbal, an automated pick and place machine to position a slider relative to the circuited gimbal, a vision system to precisely locate the slider and circuited gimbal with respect to each other, and the pick and place machine to place the slider on the circuited gimbal. The electrical contacts in the slider are then terminated to the traces or electrical leads of the circuited gimbal using an automated electrical termination machine.

Following termination, the head/slider/circuited gimbal assembly may have a dynamic electrical test performed on it at a dynamic electrical test station. The assemblies can be sorted based upon the test results and those that do not meet the test specifications can be sorted from the assembly process.

Following the DET, those assemblies meeting the DET specifications will be attached to suspensions in an automated assembly apparatus. The assemblies will be placed in the apparatus and measurements will be made of the suspension static angles with reference to the load beam and an area near the base plate with an autocollimator. Adhesive will be dispensed by the automated apparatus onto the suspension while the static angles are measured on the air bearing surface of the head/slider/circuited gimbal assembly relative to the circuited gimbal body. The air bearing position relative to the suspension load point will be determined so that the torque that acts on the air bearing is optimized in pitch and roll directions. The assembly can then be mounted to the suspension.

The foregoing objects of the invention will become apparent to those skilled in the art when the following detailed description of the invention is read in conjunction with the accompanying drawings and claims. Throughout the drawings, like numerals refer to similar or identical parts.

BRIEF DESCRIPTION OF THE DRAWINGS

FIG. 18 is a histogram representing an improved torque distribution using this invention without directly measuring the suspension load position.

DETAILED DESCRIPTION OF THE INVENTION

Figure 1:
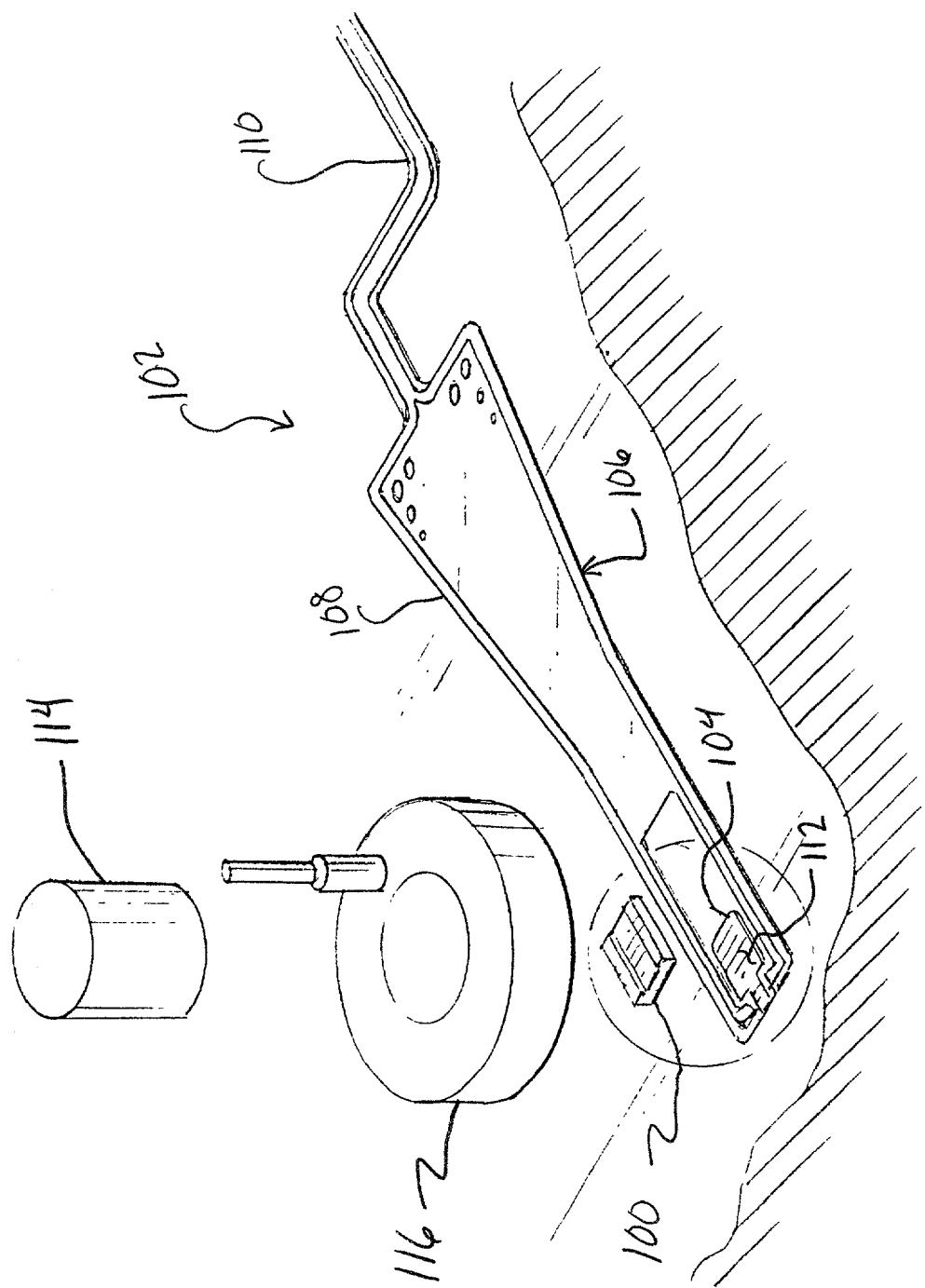
FIG. 1 illustrates an isometric view of a head slider bond station.

A solution to each of the above mentioned problems is a novel process flow combined with processing methods to accurately attach a read/write head/slider, make the electrical connection, perform a dynamic electrical test on the head prior to suspension attachment, measure static angles without loading the suspension and manage the final torque acting on the slider body to assure proper flying characteristics. This method will first be described generally and then more specifically to follow.

A tray or batch of head sliders are mounted to circuited gimbals in an automated pick and place machine, utilizing vision, stages, adhesive dispense and ultra-violet (UV) tacking. Such machines are known in the art and will be described generally herein. The circuited gimbals are of the type that includes integral traces, but are not completed suspension assemblies. The sliders are provided as individual pieces in their own respective package.

Once the sliders and circuited gimbals are placed in the assembly apparatus, adhesive is dispensed on the circuited gimbals and the slider is picked from its tray with a vacuum collet of the pick and place machine. The slider is brought to hover over the circuited gimbal. The vision system of the pick and place machine aligns the air bearing surface to the electrical termination pads of the circuited gimbal or optical alignment fiducials found on the circuited gimbal and/or slider, which facilitates predictable electrical termination in the next operation. The air bearing is not placed relative to a load point, since the suspension is not yet present. Holding of the slider circuited gimbal in this operation is simple, since it is a flat, predominantly two-dimensional structure. The slider is brought to the circuited gimbal with a precise and known Z-force from the Z-stage, providing a very controlled placement. As the slider is held, UV light may be used to tack cure the adhesive to hold the desired position. The batch of head/slider/circuited gimbal assemblies can be oven cured off-line.

A batch of head/sliders attached to circuited gimbals is brought to an automated electrical termination machine, such as a gold ball or ultrasonic wedge bonder. Since the circuited gimbal is predominantly two dimensional and the head/slider is firmly attached with adhesive, holding the assembly during electrical termination is very easy. Further, since the suspension is not yet present, the manufacturer does not need to be concerned about damaging the suspension with this operation.

The electrically terminated head/slider/circuited gimbal assemblies are brought to an automated DET station with the air bearings facing away from a vacuum collet pick up. Much like a pick and place machine, a vacuum collet picks up an individual head/slider/circuited gimbal assembly and brings it in proximity to a spinning test disk. During the vacuum pick up, a temporary electrical connection is made. The precise and known force through the z-stage is also the force passing through the slider air bearing. Thus, the slider can fly and position the head at the proper magnetic spacing without the presence of a suspension. During this test, numerous sensitivities can be determined on the individual heads, by varying the load, skew angle, disk speed and so on. Heads can be sorted into good, marginal and bad bins. Since this test occurs before a suspension is present, the test allows the assembler to discern head failures due to the heads and not the suspension. Further, this method enables the assembler to save a significant cost by not bonding bad head/sliders to good suspensions.

Trays of good head/slider/circuited gimbals are next assembled to suspensions. A pick and place machine with vision, adhesive dispense, a vacuum collet and UV tack source is used. The suspension static angles are measured with reference to the beam and an area near the base plate with an autocollimator. Adhesive is dispensed onto the suspension. On the head/slider/circuited gimbals, static angles are measured on the air bearing surface relative to the circuited gimbal body. The pitch and roll stiffnesses of both the suspension and the circuited gimbals are known via off-line characterization. An algorithm is used to determine the air bearing position needed relative to the suspension load point, such that the resultant torque acting on the air bearing is optimized in both pitch and roll directions. Thus, all sources of static attitude torque from the suspension, static attitude of circuited gimbals, bond line parallelism, or slider parallelism is compensated for by adjusting the load point during head/slider/circuited gimbal attachment to the suspension.

Traditionally, ESD is a major source for yield loss because, in part, of the labor intensive nature of the process. During each of the process steps described above, the head/slider is automatically handled with a pick and place machine, which greatly reduces the probability of an electrostatic discharge damaging the sensitive head. Manual handling of the electrostatic dissipative trays occurs only when the trays are closed.

Figure 2:
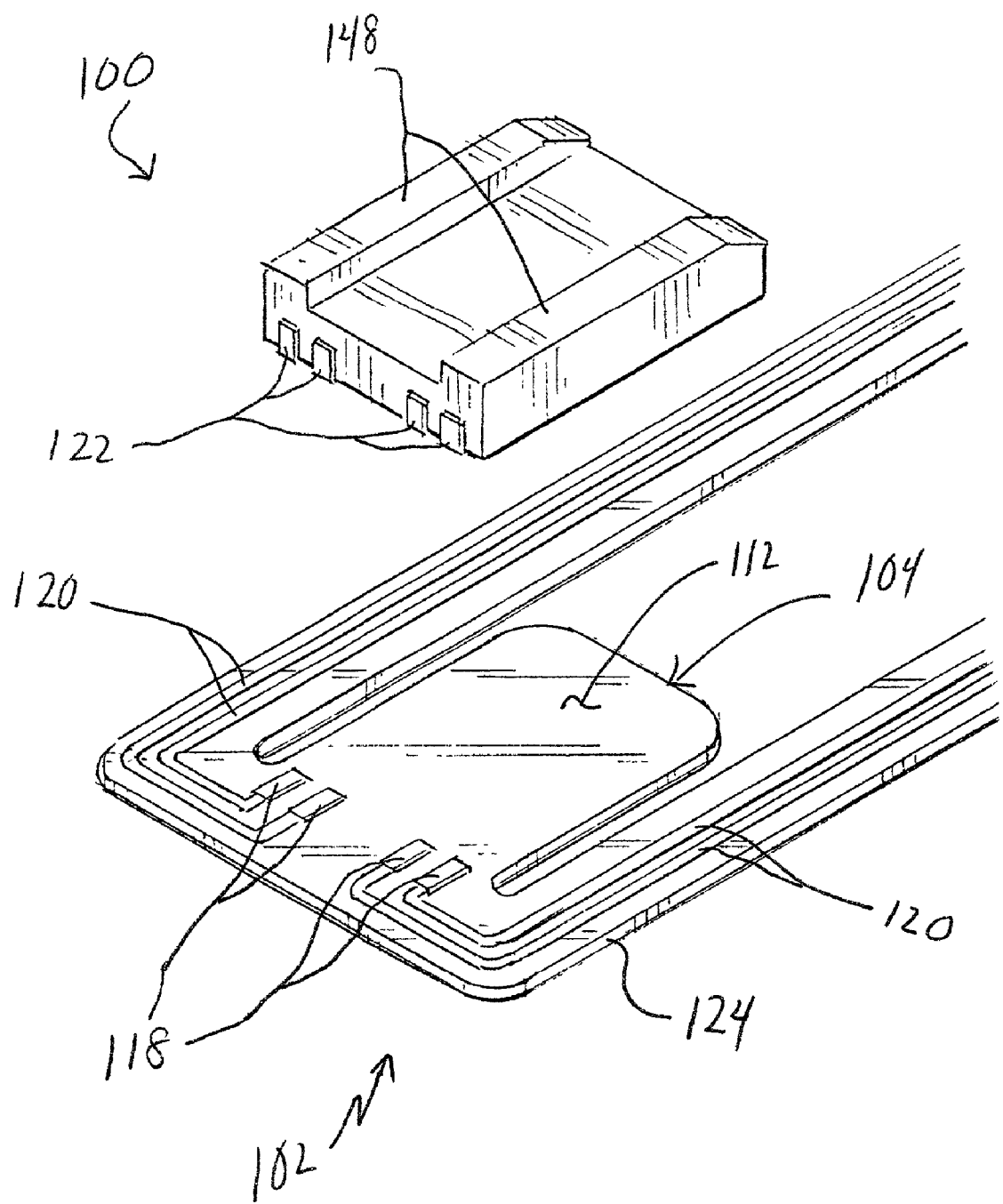
FIG. 2 illustrates an isometric view of a head slider and bond area enlarged from FIG. 1 to show electrical termination leads.

Reference will now be made to the drawings to more fully describe the foregoing process. Referring now to FIGS. 1–2, the bonding of the head/slider 100 to the circuited gimbal 102 will now be described. The circuited gimbal 102 includes a head/slider bond tab 104 and a flexible circuit 106, which in turn comprises a flex circuit body 108 and an interconnect 110. Batches of head/sliders 100 and circuited gimbals 102 will be placed in a pick and place machine (not shown in all detail). Such a machine may be purchased from Zmation, Inc. of Portland, Oreg. Such a machine will typically have ranges of motion in the X, Y, and Z directions and in an angular direction Θ about the Z axis. An adhesive dispenser will dispense adhesive onto the bonding surface 112 of the head/slider bond tab 104 of the circuited gimbal 102. The pick and place machine will have a vision system 114 associated therewith, which may be used first to place adhesive precisely onto the bonding surface 112 and subsequently to align the components 100 and 102 for precision bonding. The volume and/or pattern and/or location of the adhesive dispense, as well as the type of adhesive(s) (i.e. conductive, structural, both, etc) may vary dependant on component design.

Following the dispensing of the adhesive, the head/slider 100 will be picked from its place in the tray or batch of head/sliders by a vacuum collet 116 associated with the pick and place machine and brought to hover over the circuited gimbal bonding surface 112. The vision system 114 will precisely determine the respective, precise positions of the head/slider 100 and the bonding surface 112 and particularly the electrical termination pads 118 of the head/slider bond tab 104 for the read/write leads 120 extending to and from the head/slider 100. That is, the vision system 114 will image the precise positions of the head/slider 100 and the circuited gimbal 102 or optical targets/fiducials placed thereon and will locate the components 100, 102 using vision processing algorithms. The results of the vision processing algorithms will then be used to direct the various motion stages, typically X, Y, and Θ stages, of the vacuum collet 116 attached to the pick and place machine. That is, the results of the vision processing algorithms will be used to position the head/slider directly over the desired bonding location and to lower the collet 116 and the attached head/slider 100 with a precise and known downwardly directed or Z-force from the Z-stage of the pick and place machine to which the vacuum collet 116 is attached, onto the bonding surface 112. Thus, the present invention provides a very controlled placement of the head/slider 100 so as to precisely align the termination pads 122 of the head/slider 100 with the termination pads 118 of the circuited gimbal 102. As the head/slider 100 is held in bonding position against the bonding surface 112, UV light may be used to tack cure the adhesive to hold the head/slider 100 in the desired position relative to the bonding surface 112. This process will be repeated until the entire batch or tray of adhesions of head/sliders 100 to circuited gimbals 102 is completed, forming a tray or batch of head/slider/circuited gimbal assemblies (HSCG). The completed batch of HSCG assemblies can be oven cured off-line.

It will be understood that using the aforedescribed method of assembling the head/slider 100 to the circuited gimbal 102 results in the air bearing not being placed relative to the load point, since the suspension is not yet present. Attachment of the head/slider 100 to a circuited gimbal 102 presents several advantages over the current assembly procedure of attachment of the head/slider 100 to a completed suspension/flex circuit assembly. First, the attachment operation is simplified because the circuited gimbal is a relatively flat, substantially two dimensional structure. The flex circuit 106 typically comprises a base polyimide material 124 with this electrical leads laid thereon. Such a flex circuit usually includes a cover material also made out of polyimide. Thus, the flex circuit is substantially planar with a small thickness. Consequently, the head/slider 100 can be pushed flat against the circuited gimbal with the lowering of the collet 116 without worry about adversely affecting static attitude of the completed suspension assembly.

While the above description utilized X, Y, Z motion on the vacuum collet, it is anticipated that the tray holding the circuited gimbal could be moved with any combination of said stages rather than having all degrees of freedom attached to the collet.

Figure 3:
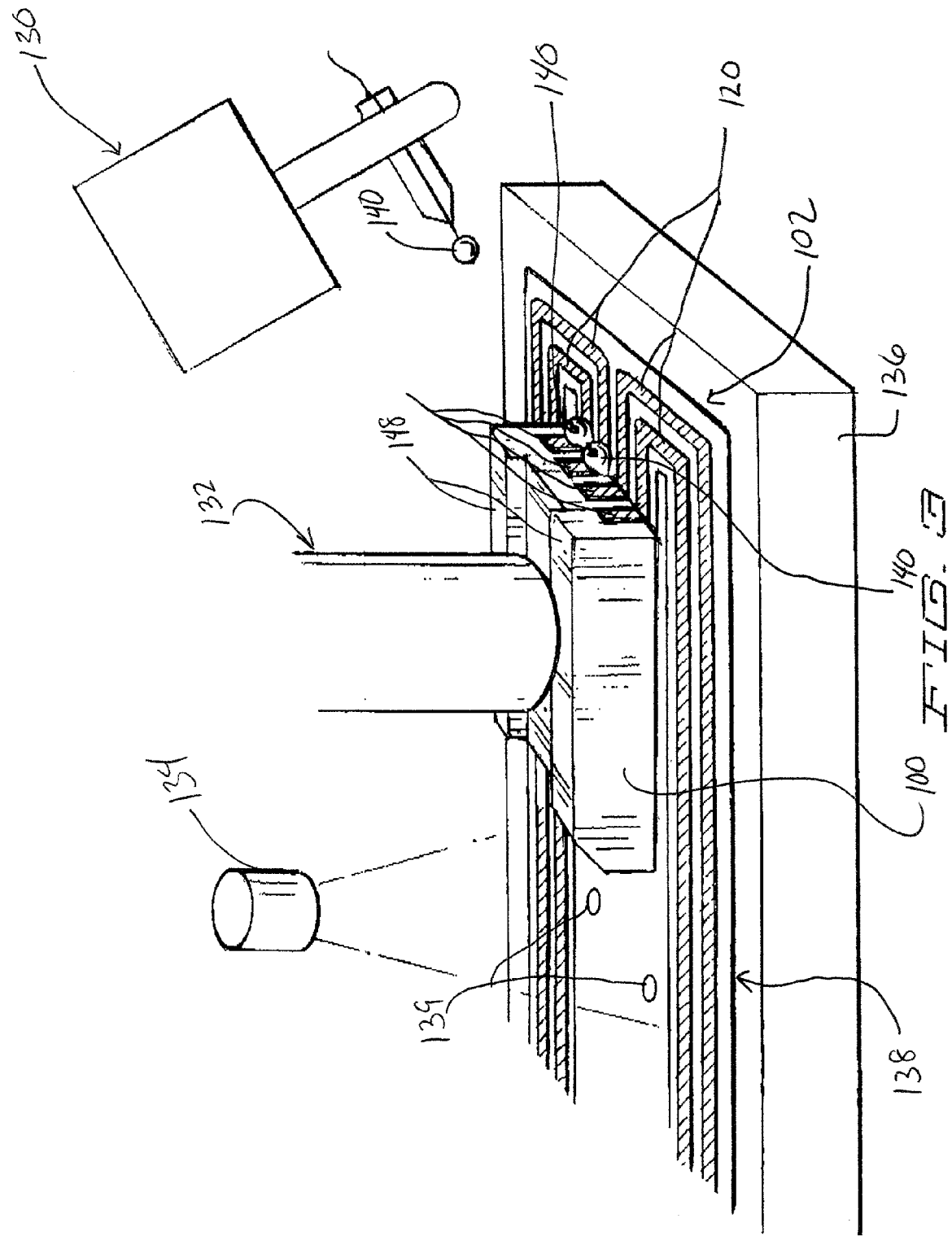
FIG. 3 is an isometric view of a head/slider/circuited gimbal during a ball bond electrical termination process.
Figure 4:
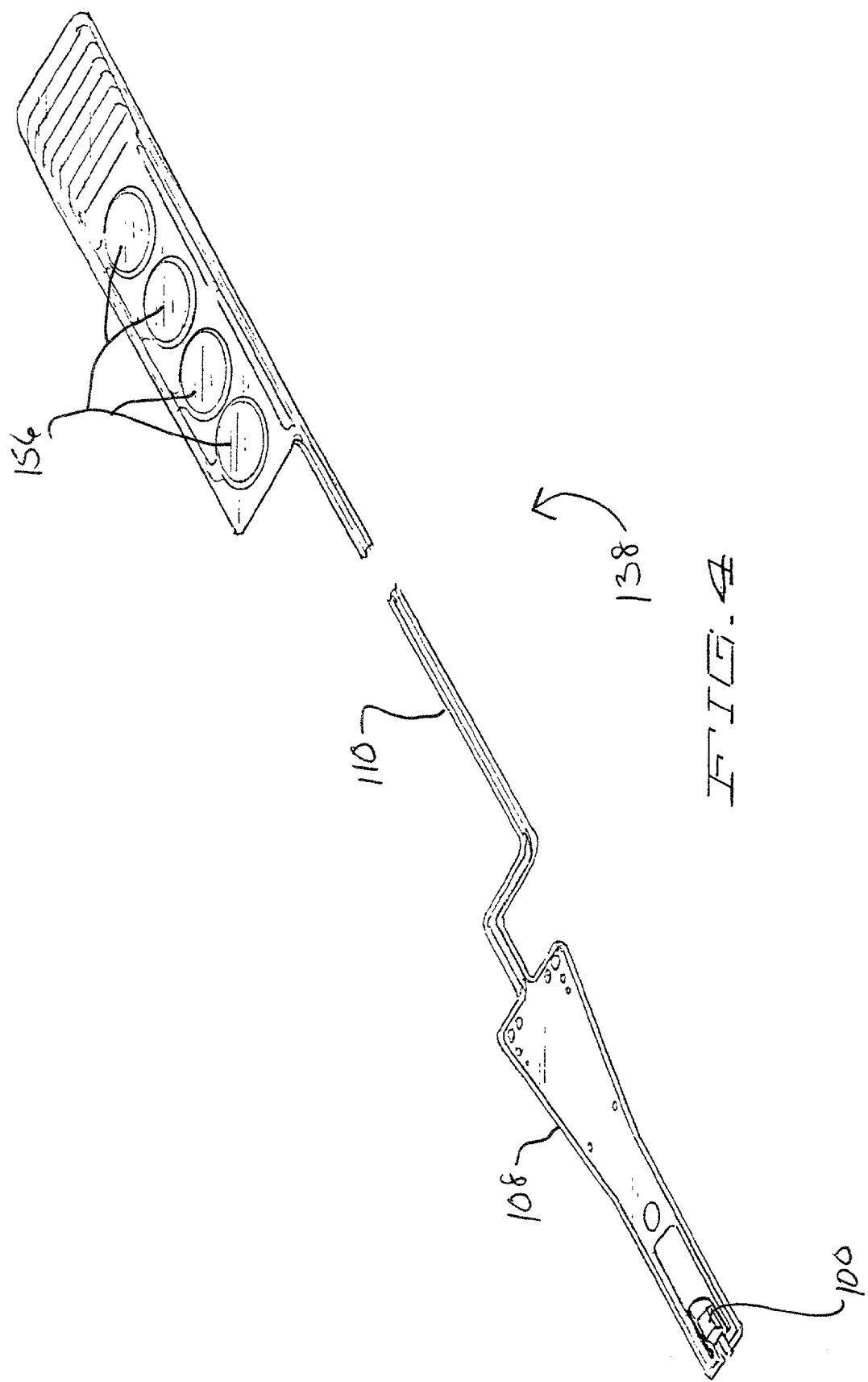
FIG. 4 is an isometric view of a head/slider/circuited gimbal assembly.
Figure 5:
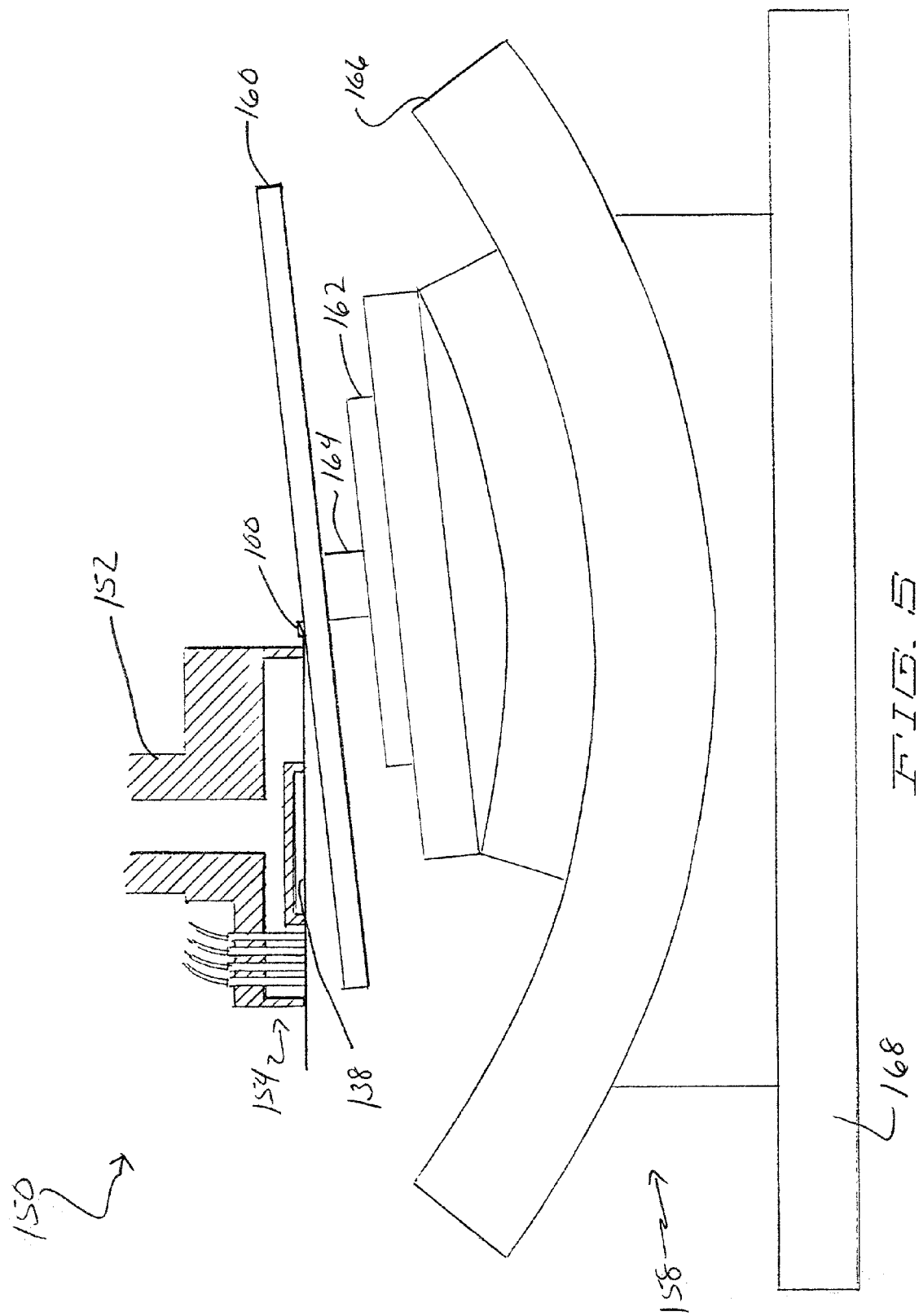
FIG. 5 is a side view of a head/slider/circuited gimbal assembly flying over a disk connected to a goniometric cradle and stage assembly.
Figure 6:
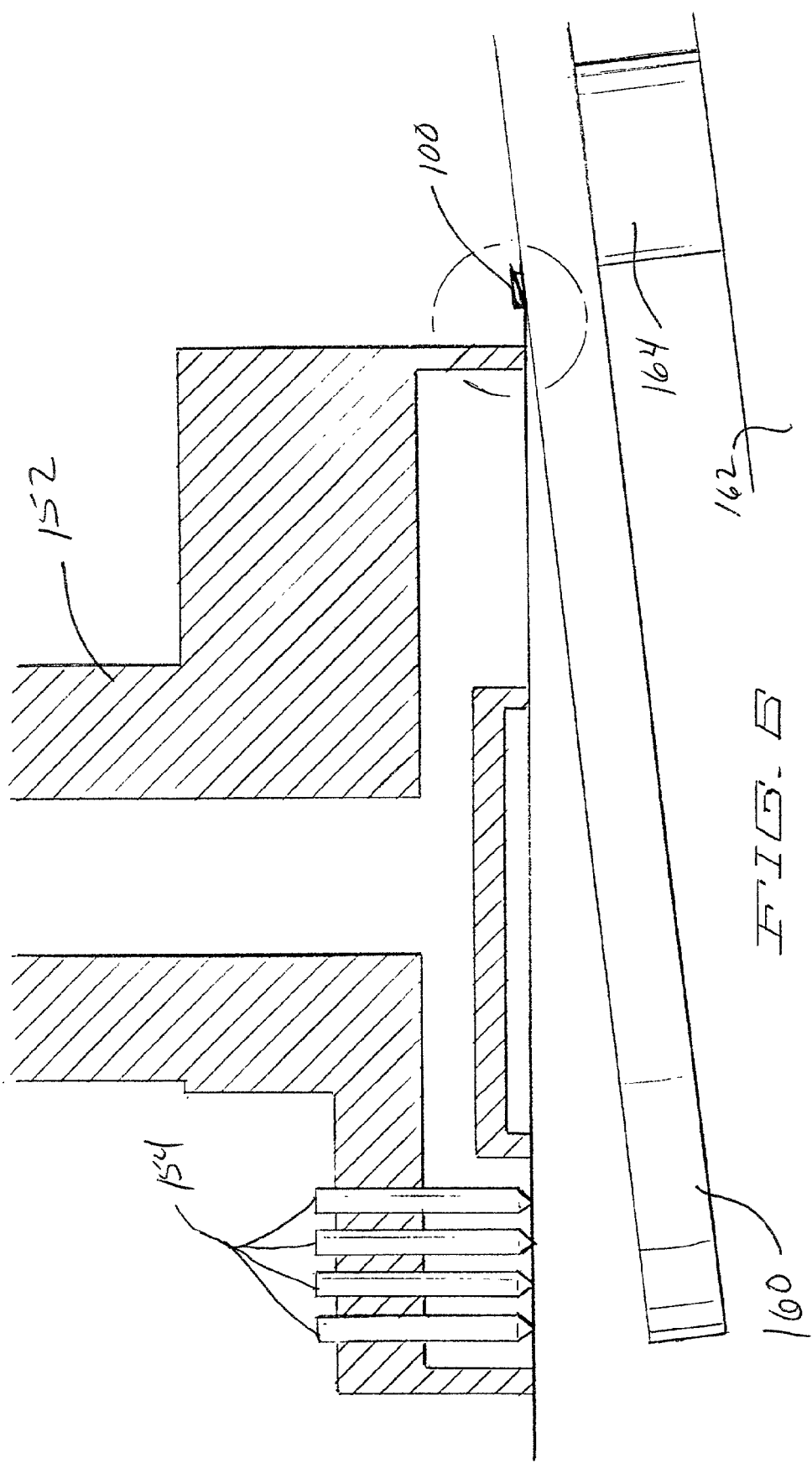
FIG. 6 is a close up of FIG. 7 showing a side view of the vacuum collet detail.
Figure 7:
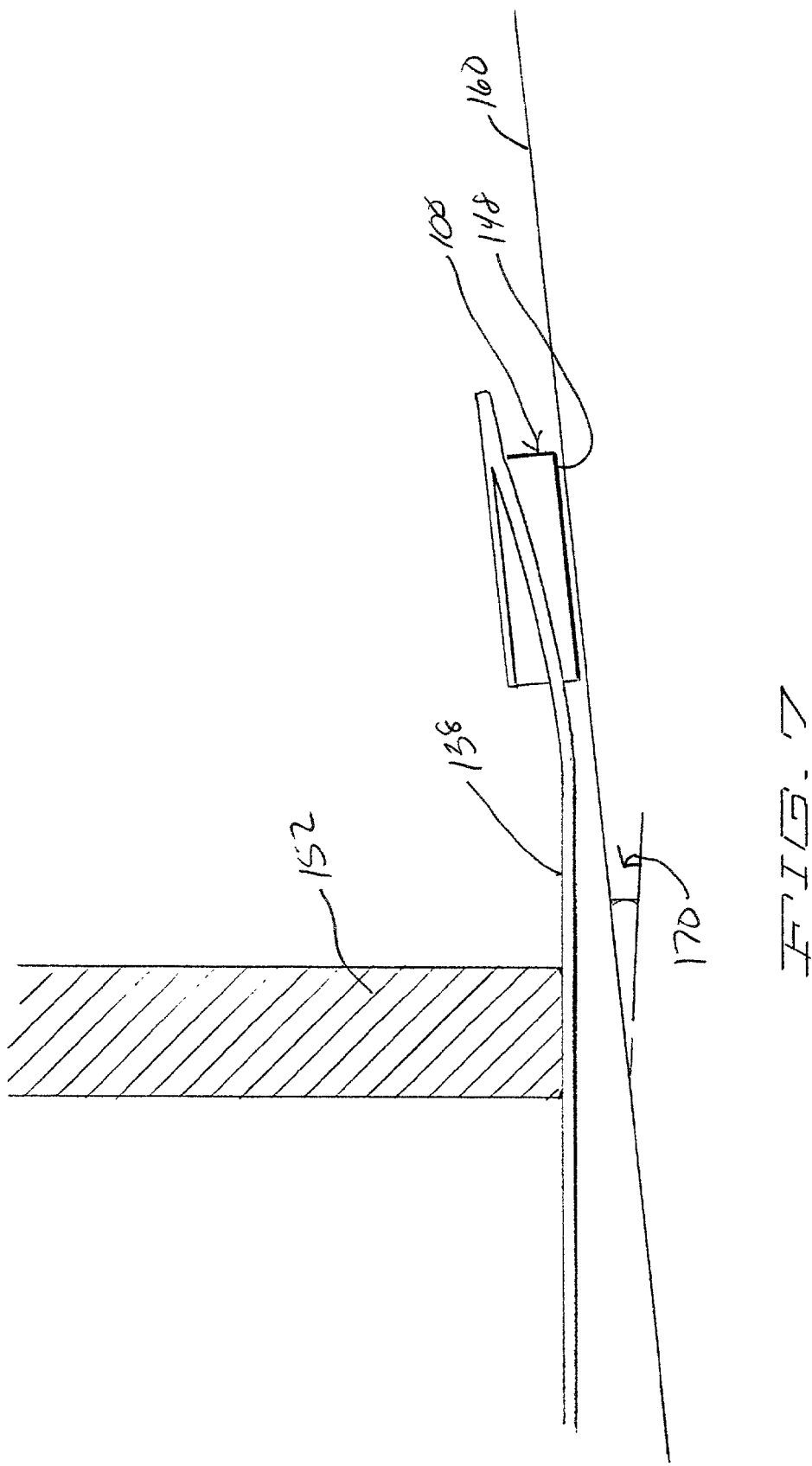
FIG. 7 is a close up of FIG. 7 showing the slider portion of the assembly with respect to a spinning disk.
Figure 8:
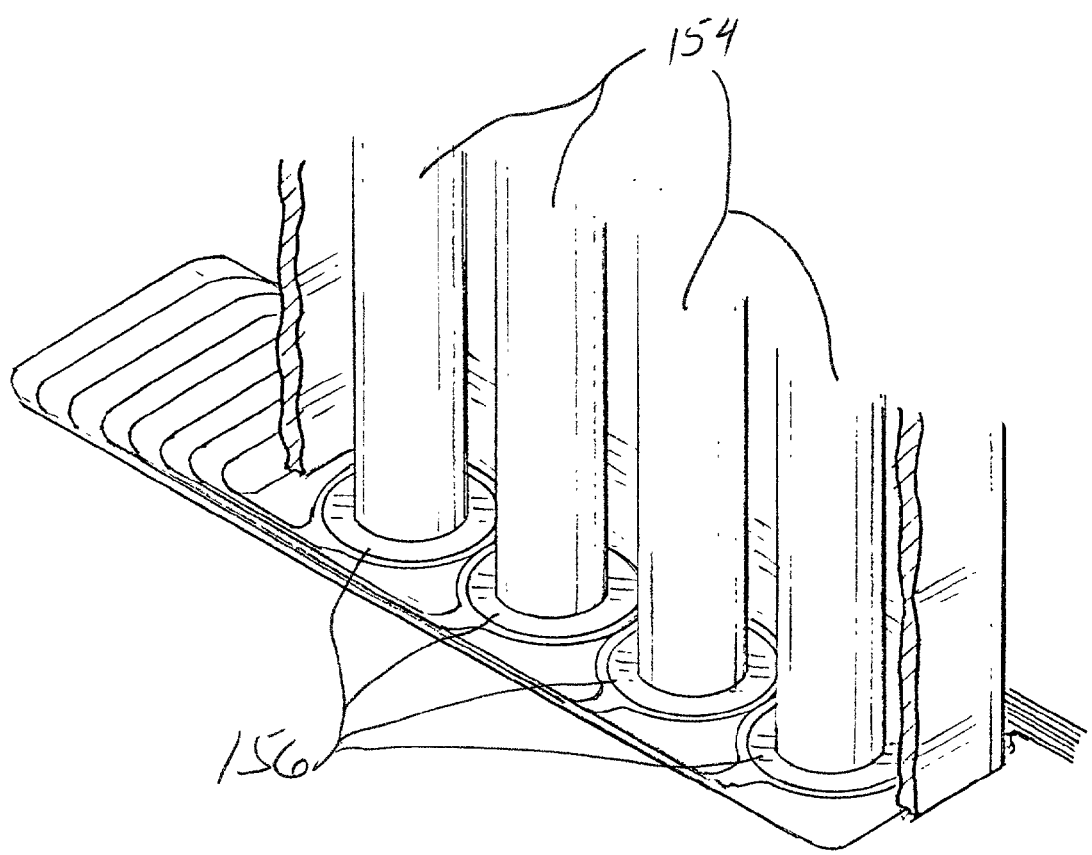
FIG. 8 is a detailed isometric view of the test pads and contact points within the vacuum collet.

Following complete curing of the adhesive bond between the head/slider 100 and the circuited gimbal 102, the terminations 118, 122 will be electrically connected in a process known as termination. Referring now to FIG. 3, the process will be described. Termination will occur in an automated termination machine, partially shown in the Figure, which will include mounted on the appropriate stages for motion in desired directions a loading station (not shown for purposes of clarity), a bondhead 130, clamp 132, and a vision system 134. Such a machine may be purchased from F&K Delvotek, Inc. of Ottobrunn, Germany. The bondhead 130 is designed for either ball bond or tab bonding, the particular type of bonding used being dependent upon the product configuration being either a ball bond or a direct lead. The loading station will preferably be an X and Y stage. The bondhead and vision system are mounted on an X,Y, and Z stage. The clamp 132 can be a part of or independent from the stages.

Termination will begin with the loading of a tray 136 or batch of HSCG assemblies 138 into the termination machine. Once loaded, the vision system 134 will individually locate either the head/slider edges, head pads, head/slider air bearing surface or the circuited gimbal fiducials 139 or any other predictable surface geometry thereof to properly locate the termination targets, termination pads 122. Once the HSCG has been optically located, the HSCG assembly will be clamped by clamp 132 and held gently in position to withstand the lateral forces of bonding. Using the information provided by the vision system 134 to precisely locate the termination pads 122, the bondhead 130 will be moved into position over each termination target and will bond the termination pads 122 to the leads 120 with a material such as gold, shown in the shape of a gold ball 140 in the Figure. Once the termination of an HSCG assembly is completed, the HSCG assembly will be unclamped and the bondhead will be positioned over the next part to repeat the process until the entire tray of HSCG assemblies is terminated.

If desired, the tray 136, fixture, or other surface upon which the HSCG assemblies are presented for termination can be constructed such that the HSCG can be heated to facilitate termination. In addition, the bondhead 130 or part tray 136 may be mounted at an angle to promote optimal scrubbing of both the leads and slider pads during bonding.

The advantages over conventional methods of this automated method for terminating leads to sliders without the presence of suspensions are numerous. First, since the suspension is not present during this operation and vision is utilized, fixturing is simplified and thus provides flexibility, low maintenance, and low cost. Second, better clamping and substrate—that is, tray or fixture—heating will promote improved bonding quality. Third, as with the process of bonding the head/slider 100 to the circuited gimbal 102, because of the flat, predominately two dimensional structure of the HSCG assembly, the tooling needed to hold the HSCG assemblies can be flat and require only the use of rough locating features. This significantly reduces the complexity of the tooling, increases its compatibility with other part configurations, and enables bonding to occur with no static attitude damage. Fourth, the use of a vision system to locate the termination targets will guarantee accurate bond placement. Accurate termination placement is aided by the accurate lead to pad alignment already performed in the previous process of bonding the head/slider to circuited gimbal. In conventional slider attachment processes, the main objective is to align the head/slider with the suspension's load point or dimple. This conventional method, however, does not guarantee good pad to lead alignment, which may cause poor termination. In the inventive process, head/slider termination is done independent of the presence of a suspension. Therefore, the main objective is pad to lead alignment and; hence, good termination. The alignment of the head/slider to the suspension occurs at a separate post termination process: Torque Management. Fifth, because this is an automated process, the risks of contamination and ESD and EOS are minimized. Finally, if a reject occurs, scrap cost is less because a suspension is not wasted. Cost savings also result from a reduction in cycle time and direct labor costs.

While the present description uses ball bonding as an example, it is contemplated that other electrical connection methods can be used without deviating from the spirit of the present invention.

Following termination, the electrical properties of the HSCG assembly can be determined using a DET process. The DET is a quality control test employed to determine whether the electrical characteristics of the head and circuit are acceptable. This test process will be described with respect to FIGS. 4–8. In the preferred embodiment, the DET is performed in an automated fashion by a dynamic electrical test machine, or DETM 150.

In general, and as is known in the art, the DETM consists of the following principle components: 1) an X, Y, Z, and Θ motorized gantry system, 2) a pattern recognition system, 3) a spinstand mounted to a goniometric cradle and a nano X-Y stage, 4) the test electronics, and 5) an instrumented vacuum collet. Again, because such machines are known in the art, they will only be briefly described. Such a machine may be purchased from Zmation, Inc. of Portland, Oreg.

The instrumented vacuum collet 152 is mounted to the Z-theta motor, and thus has X, Y, Z, and theta range of motion. The vacuum collet's contact probes 154 are electrically connected to a preamplifier and the associated instrumentation required for head characterization. The camera and optics for the pattern recognition system are mounted to the gantry head, and have X, and Y motion. The spin stand, nano-stage and goniometric cradle are mounted on the DETM within the range of motion of the gantry head. The HSCG assemblies are orientated in the DETM such that the air bearing surfaces 148 (best seen in FIG. 2) of the slider bodies are facing away from the vacuum collet.

To perform a dynamic electrical test on a HSCG assembly 138, the DETM first positions the optics for the pattern recognition system above a HSCG assembly 138. The pattern recognition system accurately determines the position information of the HSCG assembly 138 so that the instrumented vacuum collet 150 can be aligned relative thereto. Once aligned, the vacuum collet 150 is lowered until the probes 154 contacts the test pads 156 (FIG. 8) of the HSCG assembly, which are electrically connected to the leads 118. Vacuum is applied through the vacuum ports in the collet, securing both the test pads 156 and body portions of the HSCG assembly to the instrumented collet. In doing so, the vacuum collet's contact probes 154 each engage with their respective test pads 156 on the HSCG assembly to create an electrically conductive interface. As a result, an electrical path is established between the head and test electronics on the DETM. The HSCG assembly 138 is then positioned above the spinstand 158.

The gantry's Z-stage actuator is typically a voice coil motor. The current draw and stroke position of the Z-actuator strongly correlates to the force applied by the actuator arm of the hard disk drive. The Z-axis actuator lowers the HSCG assembly so that the slider's air bearing surfaces (ABS) begins to fly above the spinstand's spinning media disk 160. The disk 160 is rotated at the proper speed by a motor 162 attached to the disk by a spindle 164. In order for the slider to "fly" correctly in relation to the disk 160, the proper downward force must be applied to the slider. The current draw and stroke position information of the Z-axis actuator are monitored to ensure that the proper amount of force is being applied to the slider via the collet and gimbal so as to ensure the desired test conditions are being met.

As the Z-actuator applies a downward force on the body of the HSCG assembly, an equal and opposite lift force is applied to the ABS of the slider by the passage of air between the slider ABS 148 and the media disk 160. Because the two equal and opposite forces acting on the HSCG assembly 138 are substantially off-axis, the resulting moment can cause the gimbal to deflect out of plane. This out of plane deflection results in a reaction torque load that is applied by the HSCG assembly at the slider's ABS 148 and at the vacuum collet interface. The torque applied by the slider's ABS can have a significant affect on the flight characteristics of the ABS 148 over the spinning media. In order to obtain the desired flight characteristics, the goniometric cradle 166 positions the spinning media disk 160 at a substantially non-horizontal angle such that the torque applied by the slider's ABS 148 is minimized.

Once the HSCG assembly 138 is positioned over the spinstand's spinning media disk 160 and the slider's ABS 148 is in proper flight, the test electronics associated with the DETM begin to electronically characterize the head parameters. The nano-X-Y stage 168 is used to position the spinstand 158 so that the location of the head/slider 100 relative to the spinstand's spinning media disk 160 can be manipulated to correct for track positioning. In addition, this allows the test to be performed at any radial location on the media disk 160, from its inner diameter to its outer diameter. The nano X-Y stage 168 can also be used to manipulate the skew angle of the HSCG assembly 138 during testing.

Once the head's parametric characterization is complete, the HSCG assembly 138 is returned to its initial location, and the test is repeated on the next HSCG assembly.

The DETM can also be used to perform further characterizations on the HSCG assemblies 138. For example, by varying the downward force applied by the z-actuator, the angle 170 of the media disk with the goniometric cradle, the skew angle, the radial location of the head with the nano x-y stage, and/or the rotational speed of the media a head parameter sensitivity analysis can be performed.

Figure 9:
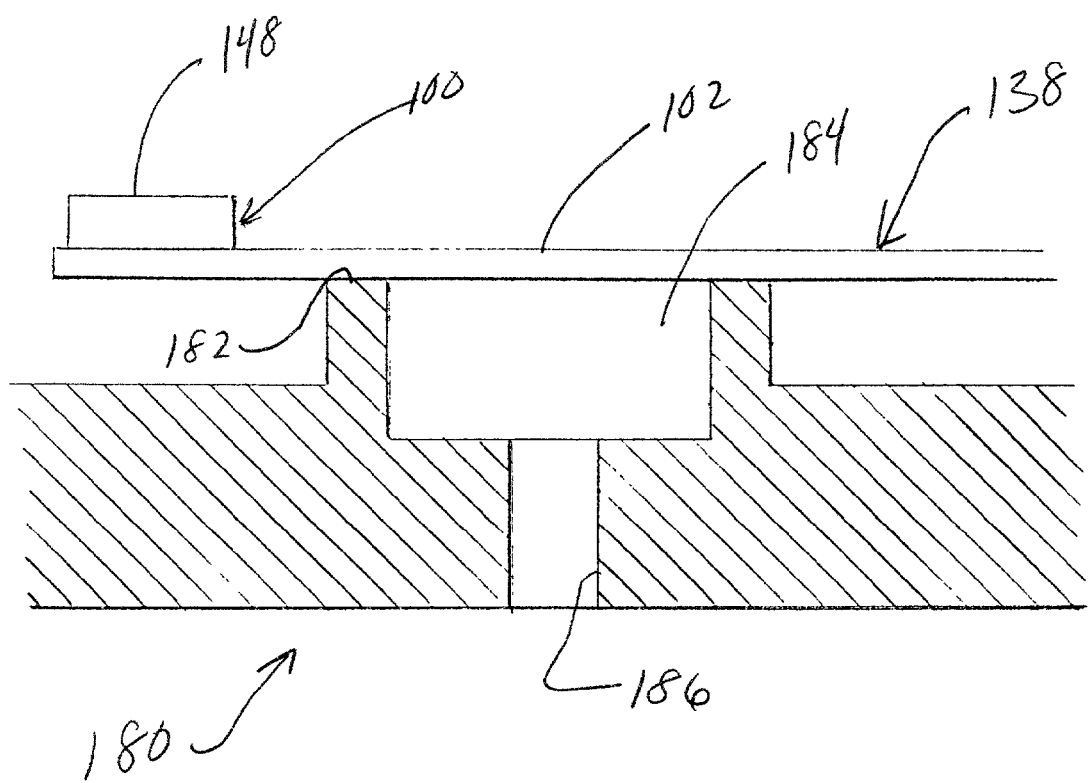
FIG. 9 is a sectioned view of a head/slider/circuited gimbal assembly held in a processing tray.
Figure 10:
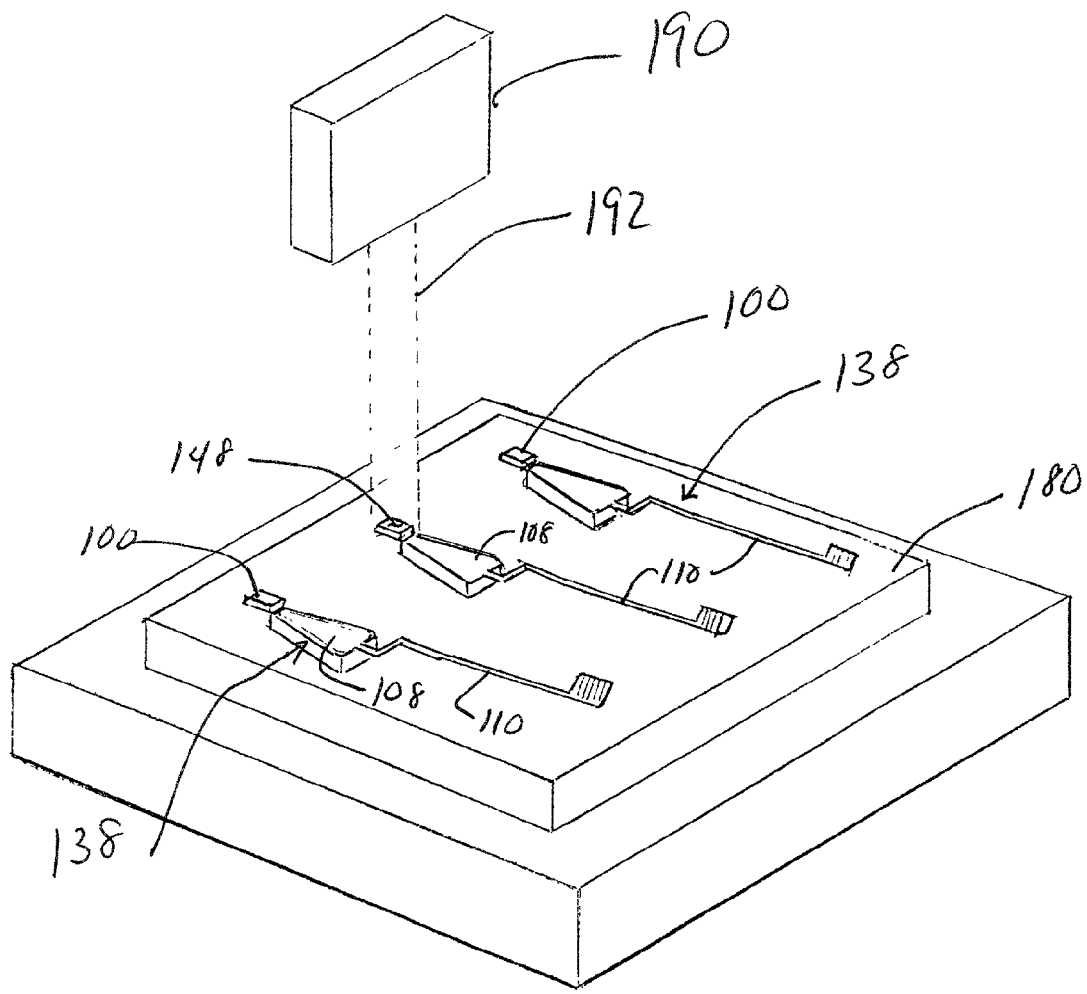
FIG. 10 is an isometric view of a static angle measurement for the head/slider/circuited gimbal in a processing tray.
Figure 11:
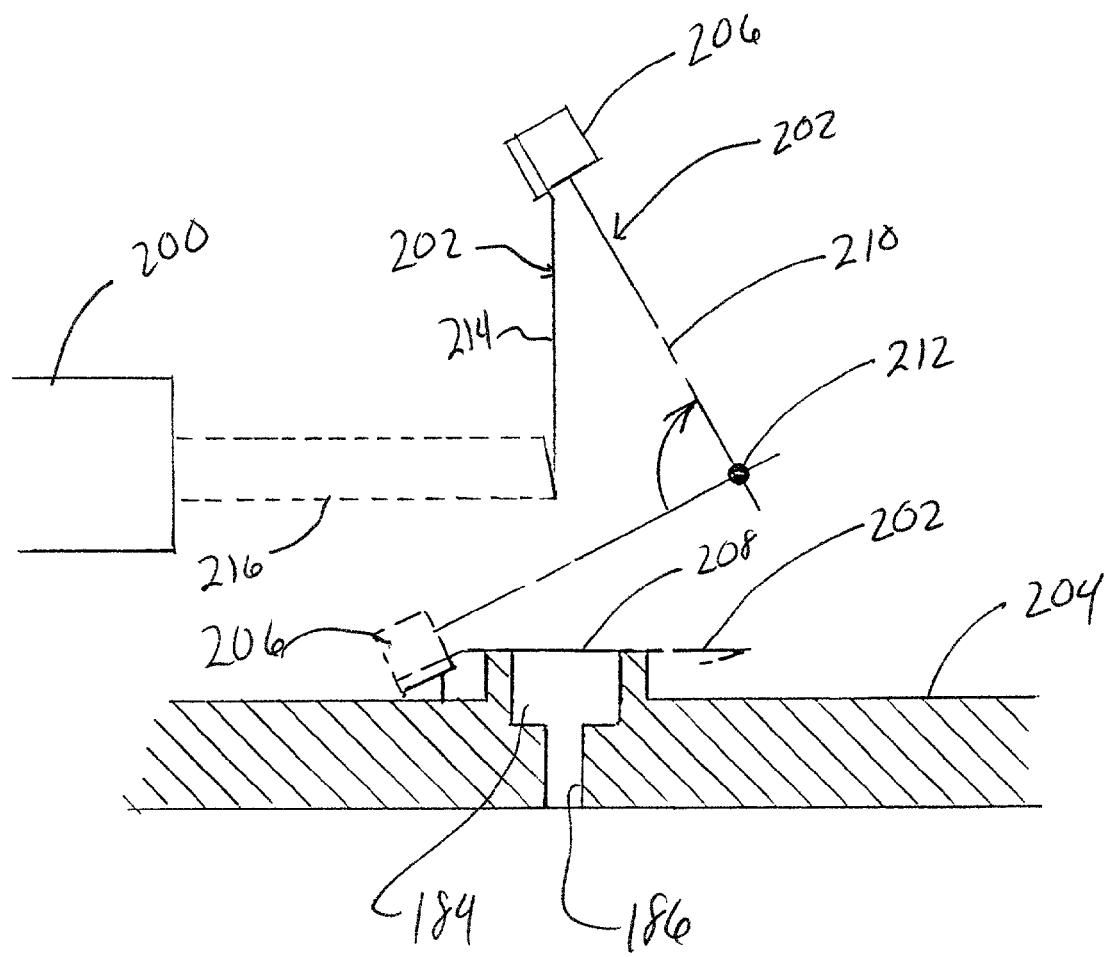
FIG. 11 is a section view of a static angle measurement for a suspension wherein the suspension is picked from a processing tray and rotated with the collet acting as reference.

Once the DET has been completed on a batch of HSCG assemblies, they are ready for a static angle measurement. Determination of the static angles on the circuited gimbal may be made using several clamping schemes and various non-contact measurement systems. In the preferred embodiment, the measurements will be conducted using an autocollimator positioned over the part in its processing tray 180, shown schematically in cross section in FIG. 9. The tray will provide the clamping surface 182 for the circuited gimbal by means of vacuum chamber 184 connected to a vacuum port 186 connected to a vacuum source, thus providing a suction to hold the HSCG assembly 138 and a controlled datum or zero reference 188. The autocollimator 190 will be positioned, during measurement, over the ABS 148 of the head/slider 100 as shown in FIG. 10. The measurement, then, provides relative static angles between the controlled datum and the air bearing surface. After the measurement is made, the static angle information for the HSCG assembly is stored for later use and the autocollimator 190 moves, via an X-Y stage, to the next part for measurement and data storage. Autocollimation is a well known technique for measuring static angles by means of a collimated beam of light 192, as shown by "Static Attitude Test Probe Operator's Guide," published by Wyko Corporation, a manufacturer of autocollimators.

In alternate embodiments, other non-contact means of angle measurement may be used, including, but not limited to: specular laser triangulation, diffuse laser triangulation, monochromatic light interferometry and white light interferometry. The circuited gimbal may also be measured using a vacuum collet as a clamping surface. Similarly, the static angles may be measured on surfaces other than the airbearing surface of the slider, such as the various areas on the circuited gimbal near or behind the slider. Any of the aforementioned embodiments for static angle measurements of circuited gimbals may be carried out in combination with other processes described herein or as a separate process.

Having determined the static angle measurements of the ABS 148, the static angles of the suspensions must now be made. Similar to the measurement of static angles on circuited gimbals, the determination of the static angles of the suspension may be made using several clamping schemes and various non-contact measurement systems.

In the preferred embodiment, the measurements will be conducted using an autocollimator 200 mounted horizontally. Suspensions 202 would be sequentially picked from a suspension tray 204, measured and replaced in the tray. The suspensions are picked up from the tray 204 using a vacuum collet 206, which clamps on a datum surface of the suspension. The collet is configured such that it allows the suspension 202 to be swung vertically from the pick position 208 to a reference position 210 about a rotation point 212 and into the view of the autocollimator 200 to a measurement position 214 where the measurement is taken on the gimbal 218 of the suspension 200 using a collimated light beam 216. On parts that do not have a gimbal surface, the measurement will be taken on the suspension beam at a location closest to its tip and where the circuited gimbal will ultimately be secured. The measurement provides relative static angles between the controlled datum and the gimbal or load beam measurements.

Measurement information for the suspension's static angles is stored for later use. The same collet 206 replaces the suspension 202 into the tray 204 before moving, via X-Y stages, to the next part to repeat the process.

Figure 12A:
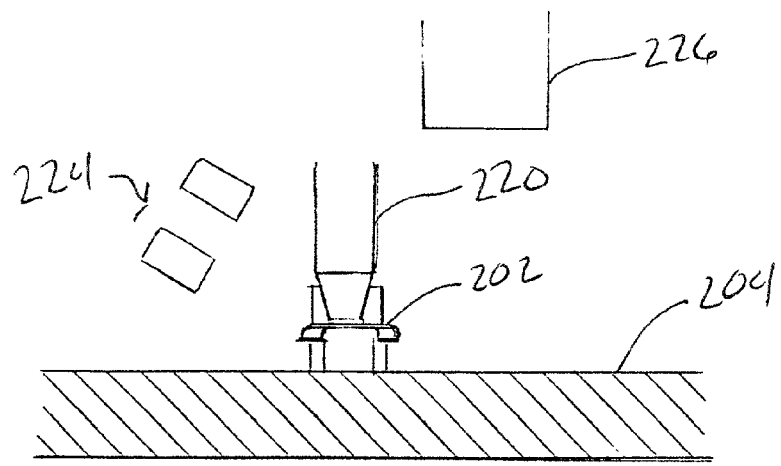
FIGS. 12A–12C are end views of a static angle measurement for a suspension wherein the suspension is picked and rotated to a reference surface from a processing tray.
Figure 12B:
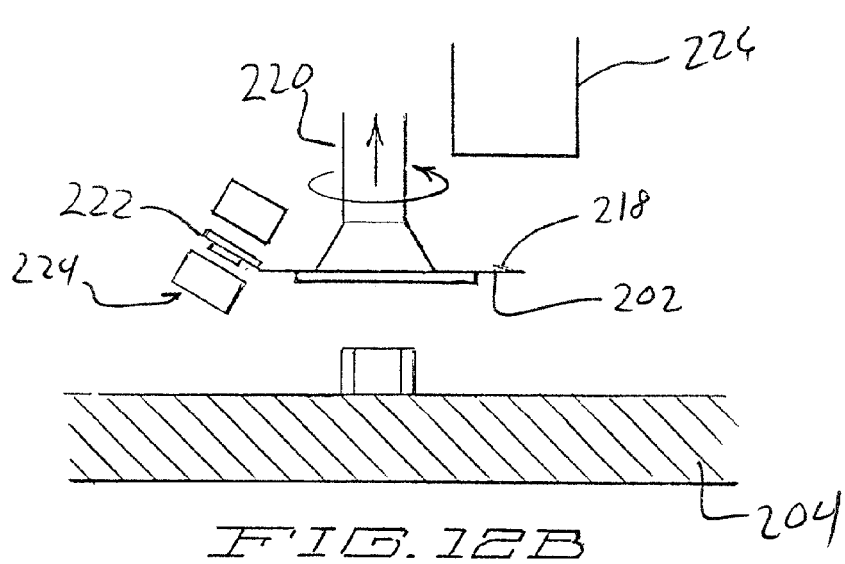
Figure 12C:
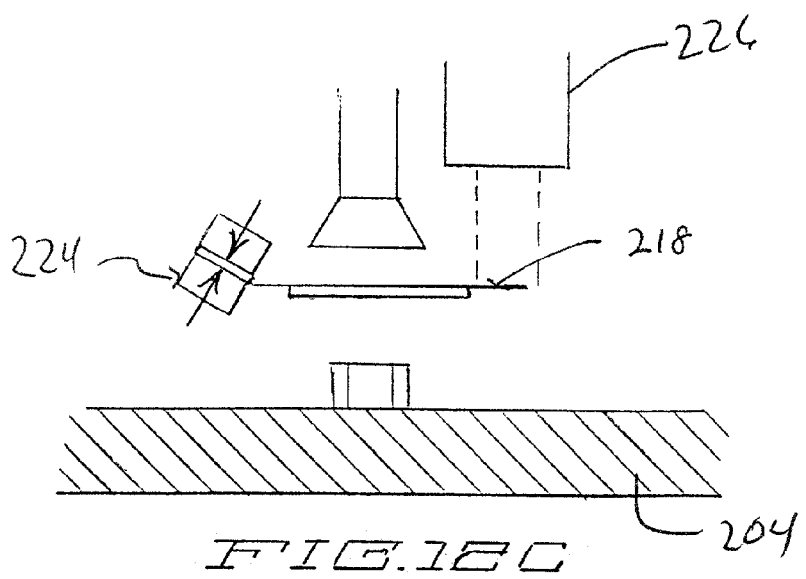

Other embodiments to achieve a similar result may be pursued if higher accuracy is required. Referring to FIGS. 12A–12C, such embodiments may include picking the suspension 202 from the tray 204 as above using a collet 220, except in a linear motion. The collet 220 then rotates the suspension 202 such that its base 222 is placed into a clamp 224 while the collet 220 is released for more precise datum pickup and such that the opposite end—the gimbal—is in view of the autocollimator 226. After measurement, the collet 220 will again pick the suspension 202 while held by the clamp 224, the clamp 224 will release, and the collet 220 and suspension 202 will rotate to their original position to then lower the suspension 202 back into the tray.

A similar embodiment would have a similar pick, but no rotation for clamping and measurement, rather, the X-Y stage would move the suspension to a remote clamp and autocollimator for measurement.

In either of the two aforementioned embodiments, the suspension 202 may be picked up by the vacuum collet either on the main section of the suspension beam or on the base itself. These embodiments are also potentially more expensive than other embodiments since the tooling costs of precise datum clamping are high.

Figure 13A:
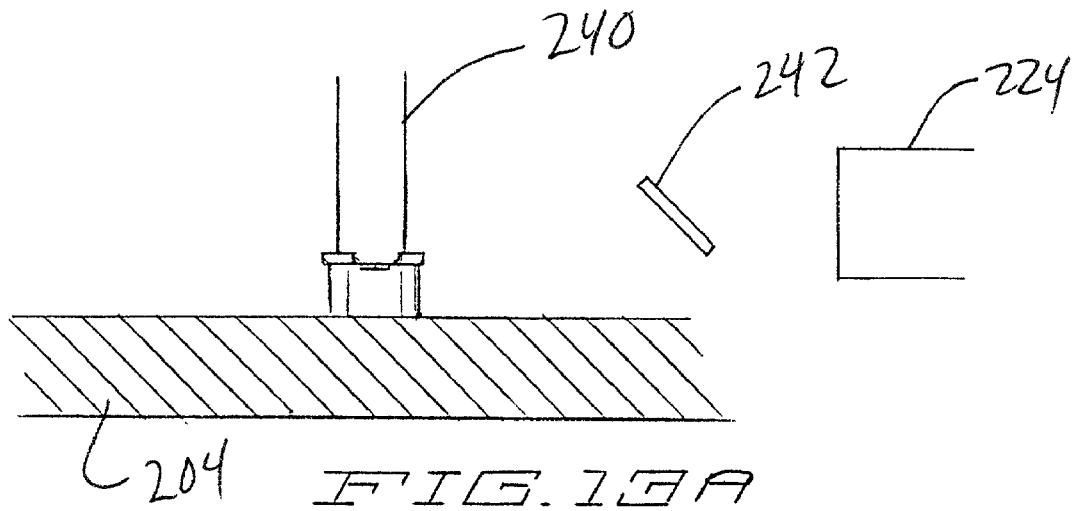
FIGS. 13A and 13B are end views of a static angle measurement for a suspension wherein the suspension is picked and rotated from a processing tray with the collet acting as reference.
Figure 13B:
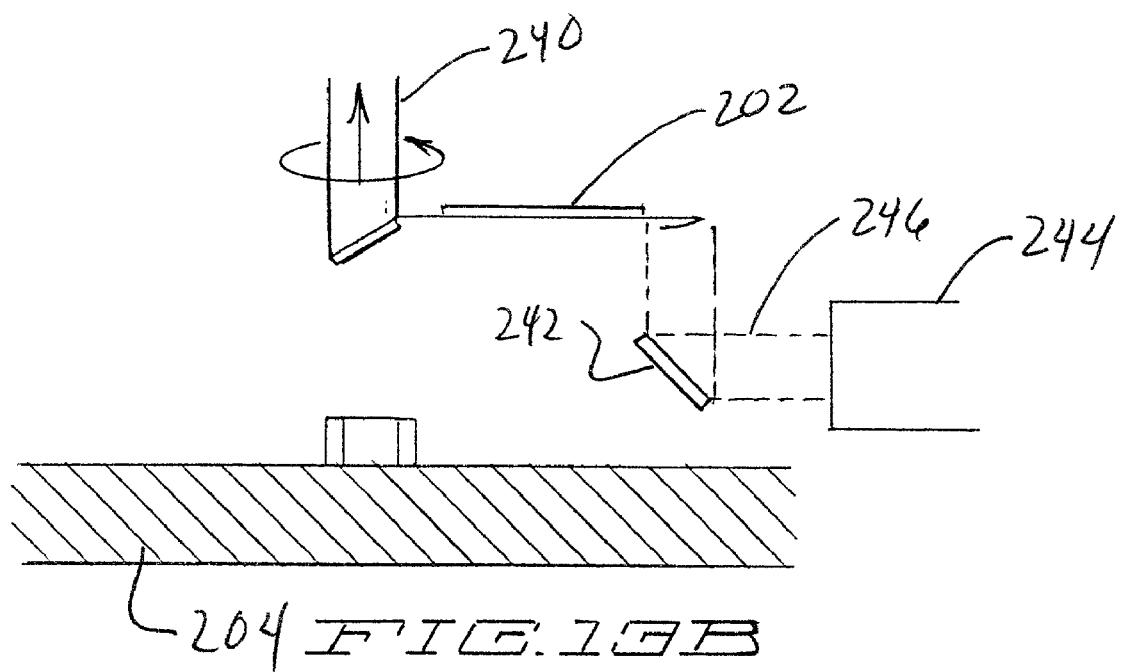

Two other embodiments, provide linear vertical collet pick up of the suspension by the base. In one embodiment shown in FIG. 13A, the collet 240 lifts and then rotates the suspension 202 horizontally, over a mirror 242 allowing the autocollimator 244 a view of the measurement area as seen in FIG. 13B. Thus, in this embodiment, the autocollimator 244 emits a beam of collimated light 246 that reflects off the mirror 242 onto the controlled datum, which is reflected back to the mirror 242 and to the autocollimator 244 for a measurement.

In still another embodiment, the collet moves via the X-Y stage to a remote measurement location for the autocollimator to obtain a view of the measurement area on the suspension.

Figure 14:
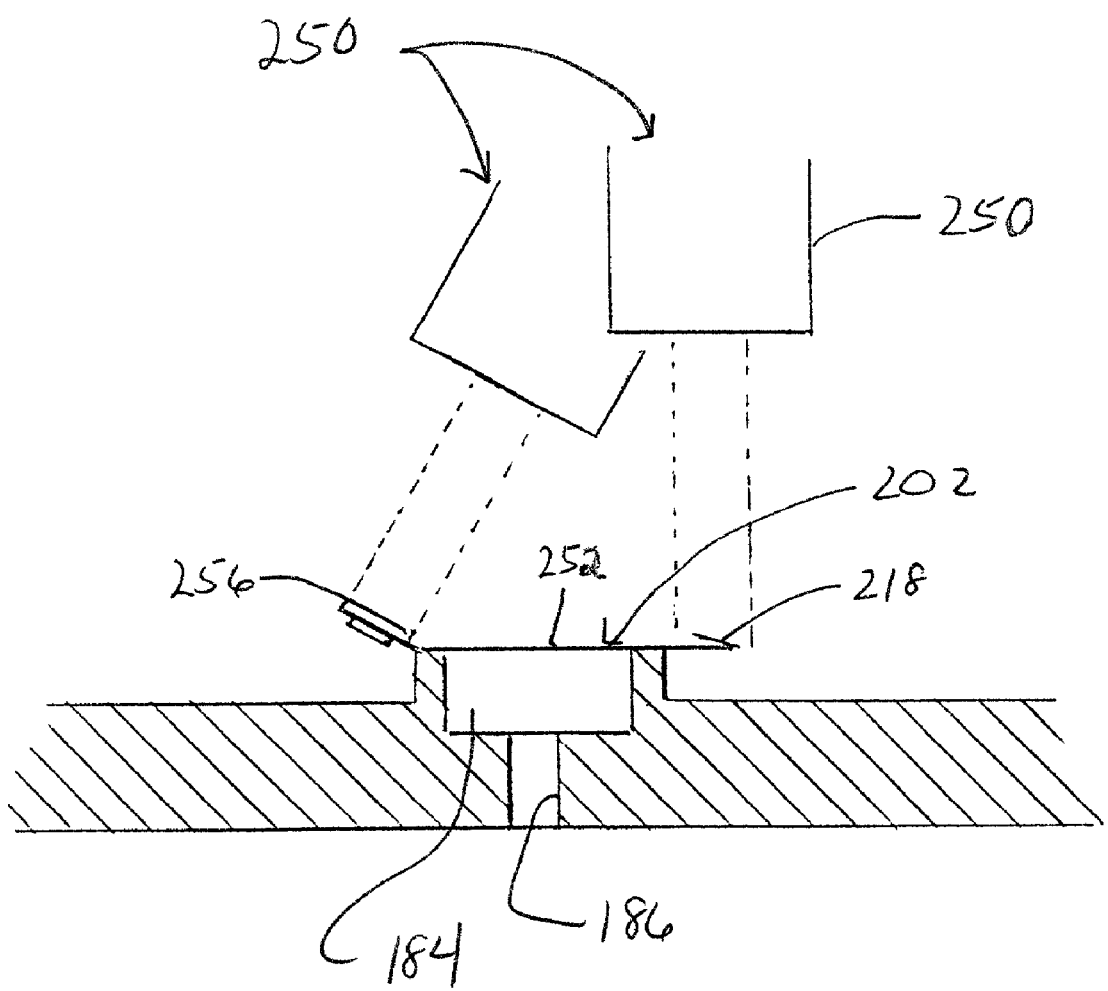
FIG. 14 is a section view of a static angle measurement for a suspension wherein the suspension is held in a processing tray and a second measurement probe provides the reference surface.

Still another embodiment allows for high speed measurements by not contacting the suspensions at all as seen in FIG. 14. In this embodiment, one or two autocollimators 250 are positioned over a part, here shown as suspension 202 though it could also be HSCG 138, using an X-Y stage. Either the parts or the autocollimator(s) 250 is moved. The part is clamped by vacuum in the processing tray 204. Simultaneous or sequential measurements are taken of the gimbal 218 or the loadbeam 252 and the base 256. This approach will result in relative measurements between the gimbal 218 or beam 252 and a surface that is not functional in the drive and therefore, this approach may not be as accurate as other embodiments.

While the above description utilized measurements at certain points on the various components, it is anticipated that other points may be taken along the length of any components.

In variations to the aforementioned embodiments, other non-contact means of angle measurement may be used, including, but not limited to: specular laser triangulation, diffuse laser triangulation, monochromatic light interferometry and white light interferometry.

Any of the aforementioned embodiments for static angle measurements of suspensions may be carried out in combination with other processes described herein or as a separate process.

Another important factor in the assembly and operation of a hard disk drive is management of the torque. The torque management process can be described sequentially in the preferred method as follows: a) The static angles, measured in a previous step of the process, for the suspension assemblies 202 are electronically loaded into the torque management computer. This data is used in conjunction with other entered data such as the pitch and roll stiffness of the suspension assemblies 202 to calculate, among other things, the pitch and roll torques of the suspension assemblies 202. b) Adhesive is dispensed onto the suspension assembly c) The static angles of the HSCG assembly 138 are now measured if not measured previously. These angle measurements are taken with respect to the body 108 of the HSCG assembly 138. The actual angles are measured on the ABS of the head/slider 100. The pitch and roll stiffness of the circuited gimbal 100 are known via off-line characterization and have previously been loaded into a torque management computer associated with the torque management station. d) With the static angles of the suspension assembly 202 and the HSCG assembly 138 now known, as well as the stiffness information, the required position of the HSCG assembly 138 relative to the suspension assembly 202 can now be calculated such that the resultant torque of the entire head gimbal assembly acting on the ABS is optimized in both pitch 300 and roll 302.

The following method for calculating the offset "X" required to optimize roll torque is shown as an example. The method for pitch torque is essentially the same. In addition, the method may vary slightly depending on such factors as methods of angle measurements and datum's for such.

Figure 16:
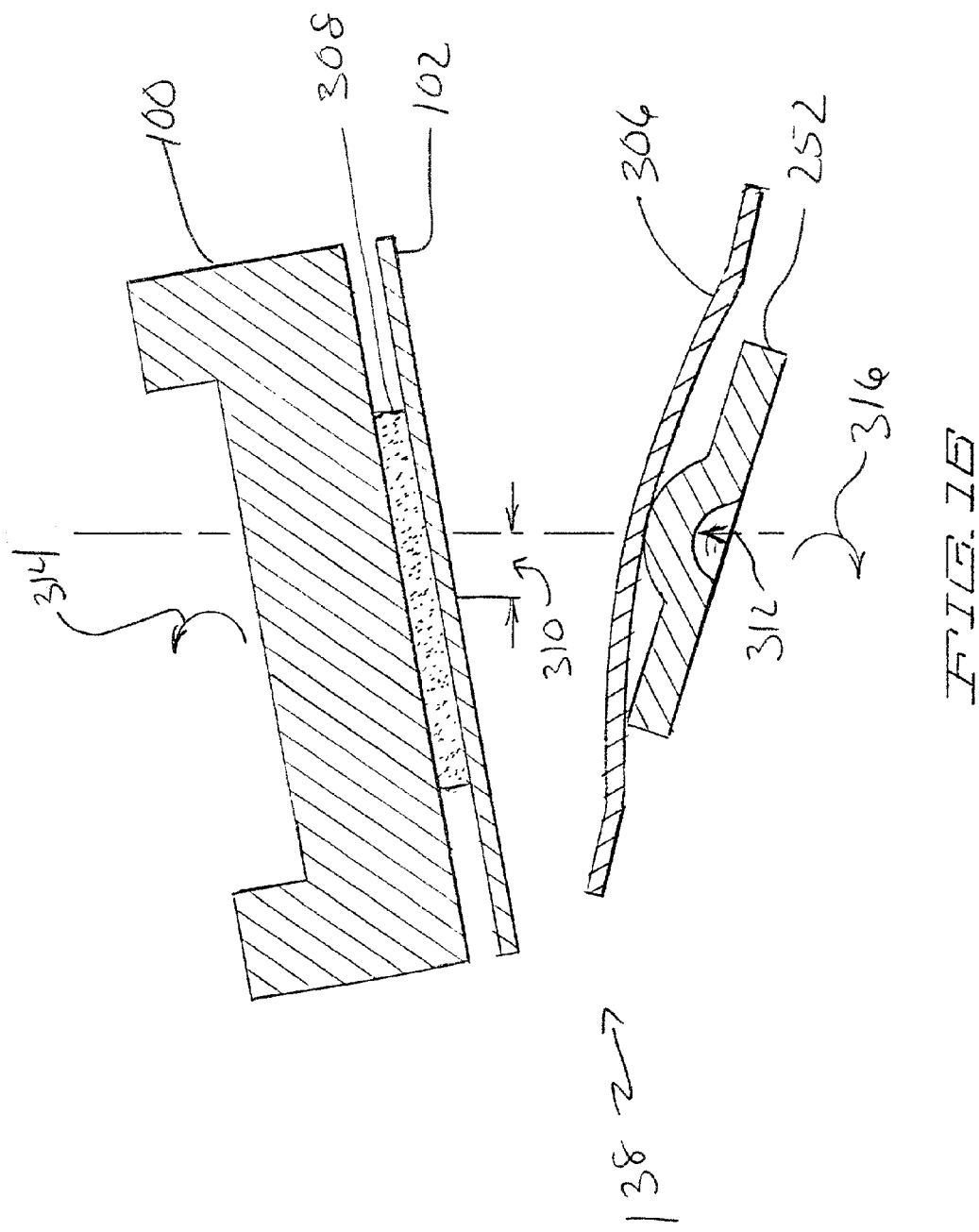
FIG. 16 is a front section view of a head gimbal assembly before a torque management bond.

FIG. 16 should be referred to for the following example of a calculation of roll torque. FIG. 16 is a cross section through a typical suspension 202 and HSCG assembly prior to attachment. Thus, the figure shows a suspension load beam 252 and the suspension flexure 306 disposed below an HSCG assembly 138 including the head/slider 100, the flex circuit 202, and an adhesive 308 bonding the two together. In doing so, it will be understood that the following symbols have the following meanings.

X=Offset (reference numeral 310 in FIG. 16)

Θ=Angle k=stiffness

M=Moment (Torque)

F=Force (i.e. $F_{Gram}$=Gram Load) (reference numeral 312 in FIG. 16)

The components of the roll torque of the circuited gimbal are as follows:

1. The roll torque of the flex circuit. This is the product of the static roll angle of the flex circuit gimbal (relative to the flex circuit body) and the flex circuit roll stiffness.
2. The roll angle of the slider relative to the flex circuit gimbal. This is usually set by the parallelism of the bond line between the slider and the bonding surface and the ABS.

Thus the roll torque of the circuited gimbal, $\Sigma M_{Circuited\ Gimbal}$ ((reference numeral 314 in FIG. 16) is given by:

$$\Sigma M_{Circuited\ Gimbal} = \Theta_{Circuited\ Gimbal} \times k_{Circuited\ Gimbal}$$

The angle of the circuited gimbals is preferably measured on the ABS (Air Bearing Surface).

The components of the roll torque of the suspension assembly are as follows:

1. The roll torque of the suspension flexure. This is the product of the static roll angle of the suspension flexure (relative to clamp surface of suspension assembly) and the flexure roll stiffness.
2. The product of the gram load and the load point shift ($X_0$)(if any).

Thus the roll torque of the suspension assembly $\Sigma M_{SuspensionAssembly}$ (reference numeral 316 in FIG. 16) is:

$$\Sigma M_{SuspensionAssembly} = \Theta_{SuspensionFlexure} * k_{SuspensionFlexure} + F_{Gram} * X_0$$

To calculate "X", a nominal roll torque is assumed. Thus:

Nominal Roll Torque ($M_{Head\ gimbal\ assembly\text{-}Roll}$)=0.00 uNm.

$$\Sigma M_{HeadGimbalAssembly} = M_{CircuitedGimbal} + M_{SuspensionAssembly} + M_{TorqueManagement} = 0$$

$M_{Circuited\ Gimbal}$ and $M_{Suspension\ Assembly}$ have been previously defined.

$$M_{TorqueMgmt} = F_{Gram} * X$$

Solving the equation for the offset X yields:

$$X = -(\Theta_{Circuited\ Gimbal} * k_{Circuited\ Gimbal} + \Theta_{Suspension\ Flexure} * k_{Suspension\ Flexure})/F_{Gram} - X_0$$

where $X_0$ is the load point shift with respect to the suspension dimple and suspension flexure.

If the gimbal is entirely integrated into the flex circuit, then $X_0$ is 0.0. If there is a flexure already attached to the suspension, the load point shift, $X_0$, should be measured. This may be done with the same vision system that is being used to precisely align the two components once X is calculated. If the dimple is an etched tower, then etched fiducials in the suspension assembly can be used to extrapolate the location of the dimple (since it may be covered up by the flexure). If the dimple is a formed dimple, than suspension load point tolerances must be precisely and accurately controlled at the suspension manufacturer (due to the fact that the load point may not be able to be measured with the vision system). There will still be some improvement in final fly height with this process, nominal and distribution size, however it may not be as significant as a product with an etched dimple or "flex as gimbal".

Figure 20:
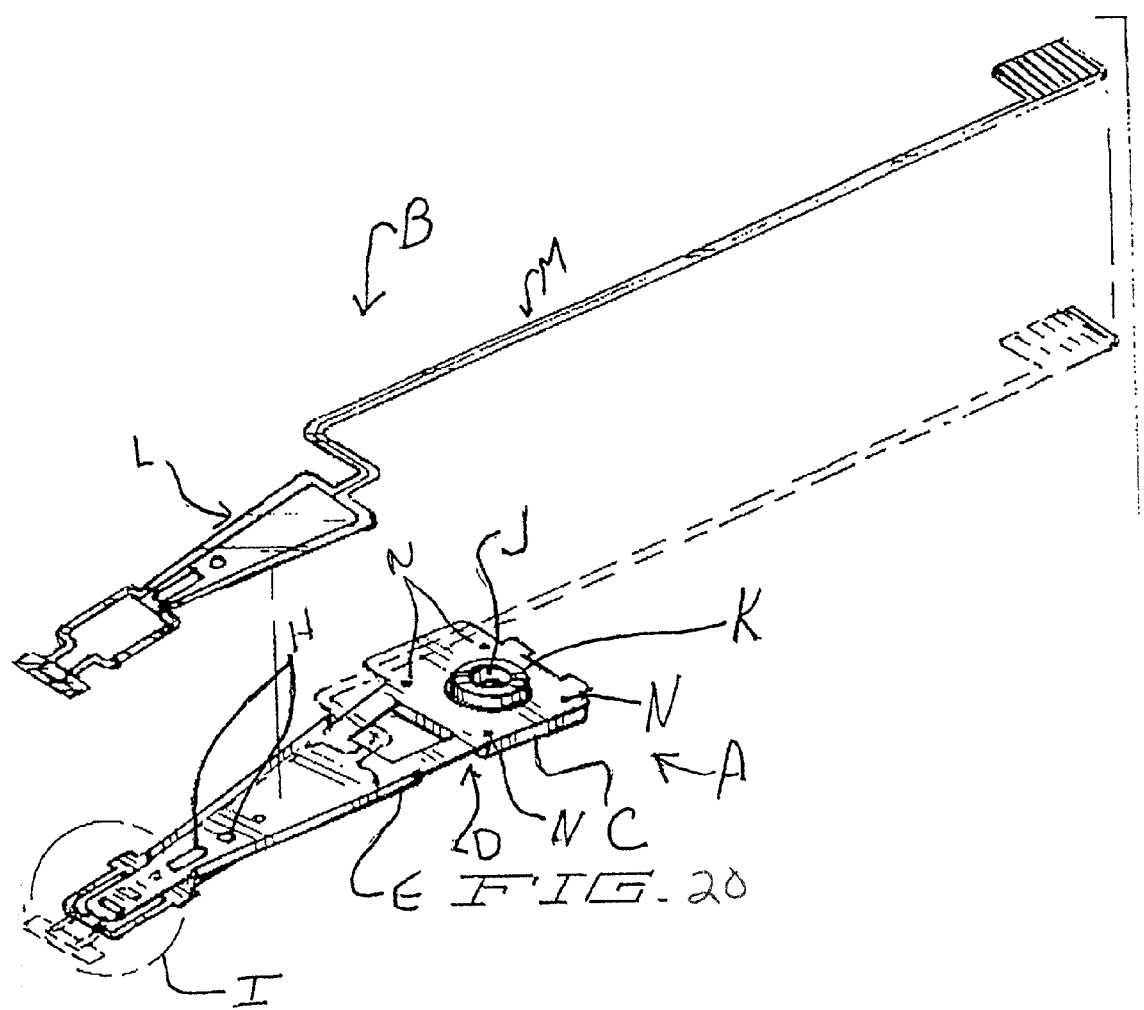
FIG. 20 is a perspective, exploded view of a suspension and an interconnect.
Figures 21, 22:
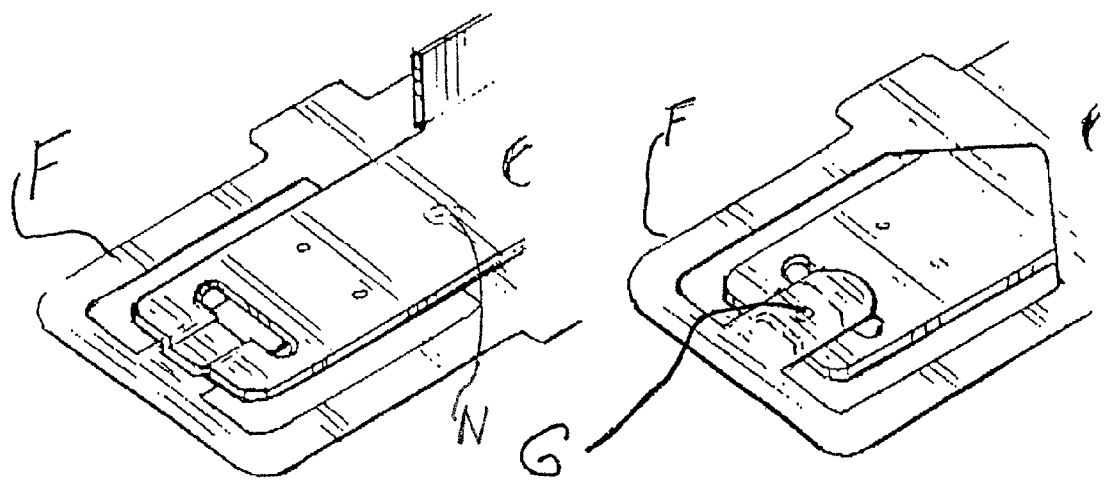
FIGS. 21 and 22 are details of the circled area I of the suspension shown in FIG. 1.

Referring now to FIGS. 20, 21 and 22, a flex circuit and suspension are shown in an exploded view relative to each other without the head slider for purposes of clarity and to more fully illustrate the components upon which the present invention is practiced. FIGS. 21 and 22 are detailed views of a portion of FIG. 20.

FIG. 20 illustrates several components including a suspension A and a flexible circuit B. It will be understood that the actual physical structures of these components may vary in configuration depending upon the particular disk drive manufacturer and that the assembly shown in FIG. 20 is meant to be illustrative of the prior art only. Typically, the suspension A will include a base plate C, a radius (spring region) D, and a load beam E. Typically the load beam E is bent in such a way that it causes a spring force, normal to the media disk, to act on the read/write head in operation. This spring force is counteracted by the lift forces that result from the read/write head's flight over the spinning media disk. The load beam E is usually bent near the baseplate C of the head suspension assembly.

A typical suspension A will also include a gimbal F having a gimbal load point G, which is best seen in the detail I shown in FIGS. 21 and 22. At least one tooling aperture H may be included. The suspension A may further include an opening or hole J extending through the base plate C and load beam E and a surrounding collar K.

A flex circuit B may include a base, which may be a synthetic material such as a polyimide, that typically supports a plurality of electrical traces or leads of the flex circuit. The flex circuit B may also include a polymeric cover layer that encapsulates selected areas of the electrical traces or leads. Referring briefly to FIG. 20 again, it will be observed that the flex circuit B includes a suspension portion L and an interconnect portion M.

The read/write head that is mounted on the head suspension assembly is mounted to the gimbal F.

Figure 15:
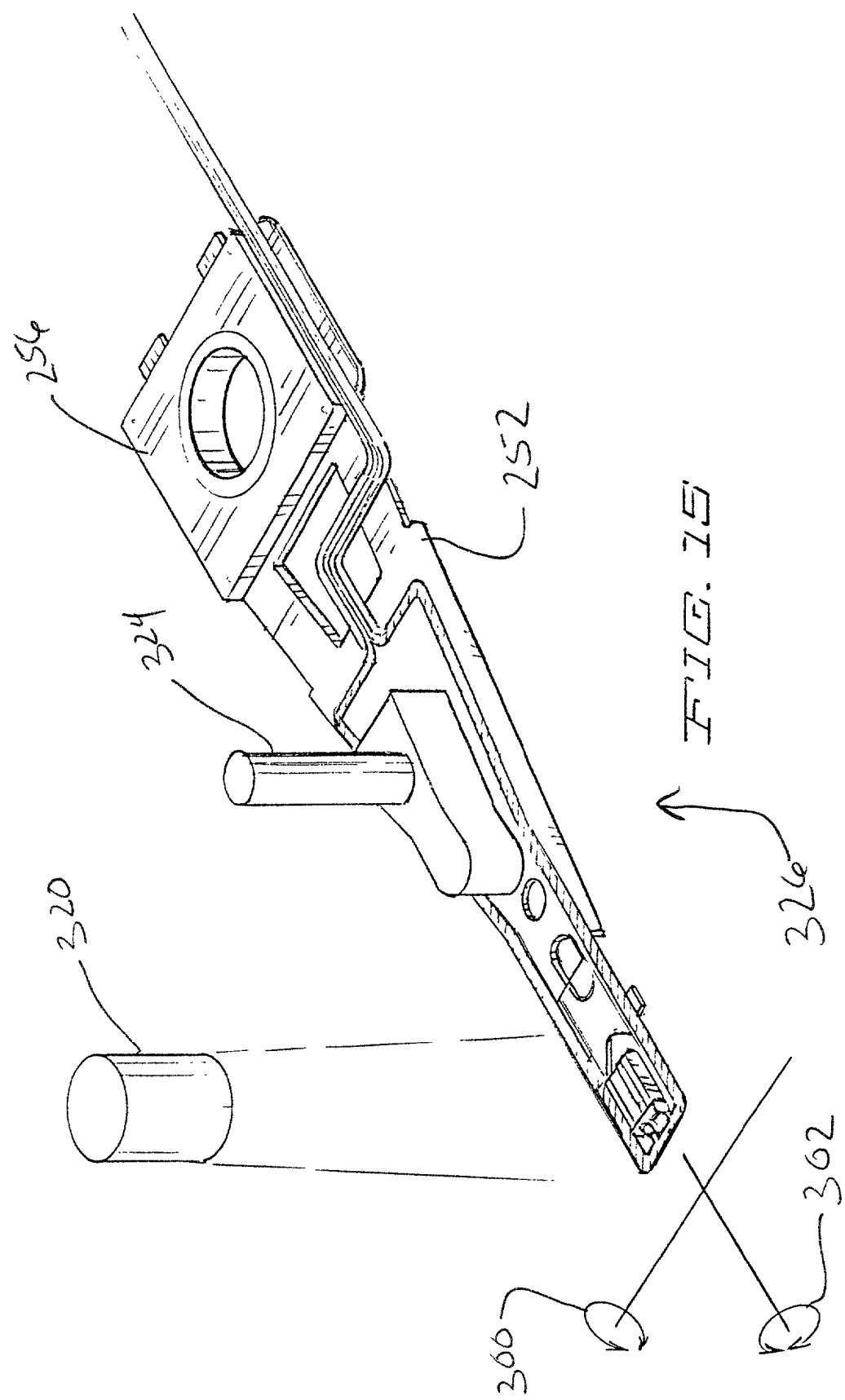
FIG. 15 is an isometric view of an assembled head gimbal assembly.

Structurally, suspensions such as that shown in the Figures have the base plate C and gimbal F welded to the load beam as indicated by weld points N. The flex circuit B is in turn adhesively attached to the suspension A Referring now to FIG. 15, the precise positioning of the HSCG assembly 138 relative to the suspension assembly 202 is accomplished in an automated assembly machine by capturing image(s) of the HSCG assembly 138 and the suspension assembly 202, usually using optical targets/fiducials placed on one or both of the assemblies, with a vision camera 320 and using vision processing algorithms to direct the X,Y, and theta stages to which the vacuum collet 322 is attached (via the z stage) to align the HSCG assembly 138 to the suspension assembly 202. With the precise positioning of the HSCG assembly 138 relative to the suspension assembly 202 now complete, the two assemblies are now bonded together. The HSCG assembly 138 is lowered to the suspension assembly 202 with a precise and known z-force from the z-stage to which the vacuum collet 324 is attached, providing a very controlled placement. As the HSCG assembly is held in place by the collet 324, UV light may be used to tack cure the adhesive to hold the desired position producing the head gimbal assembly. The batch of head gimbal assembly assemblies can be oven cured off-line. Following curing, the static angle of the bonded head gimbal assembly 326 can then be measured in order to determine if the calculation and/or placement of the slider-circuited gimbal assembly 138 to the suspension assembly 202 was successful in optimizing the resulting pitch and roll torques of the final head gimbal assembly. This information can be used to optimized the process, either automatically or manually. Additionally, the final torque can be measured as an audit for process feedback.

While the above description utilized X, Y, Z motion on the vacuum collet, it is anticipated that the tray could be moved with any combination of said stages rather than having all degrees of freedom attached to the collet.

The main benefit of the above-described process is to minimize torque variation for improved flying capabilities. The following example shows an improvement simulation model for a 3 gram head gimbal assembly. The nominal and 3 sigma variation assumptions for the model variables are as follows:

Suspension stiffness 1 μNm/deg, +/−0.25
Suspension static attitude 0 deg, +/−0.75
Circuited gimbal stiffness 0.4 μNm/deg, +/−0.15
Circuited gimbal static attitude 0 deg, +/−1.5
Gram 3 g +/−0.30
Load point 0 μm, +/−30

Figure 17:
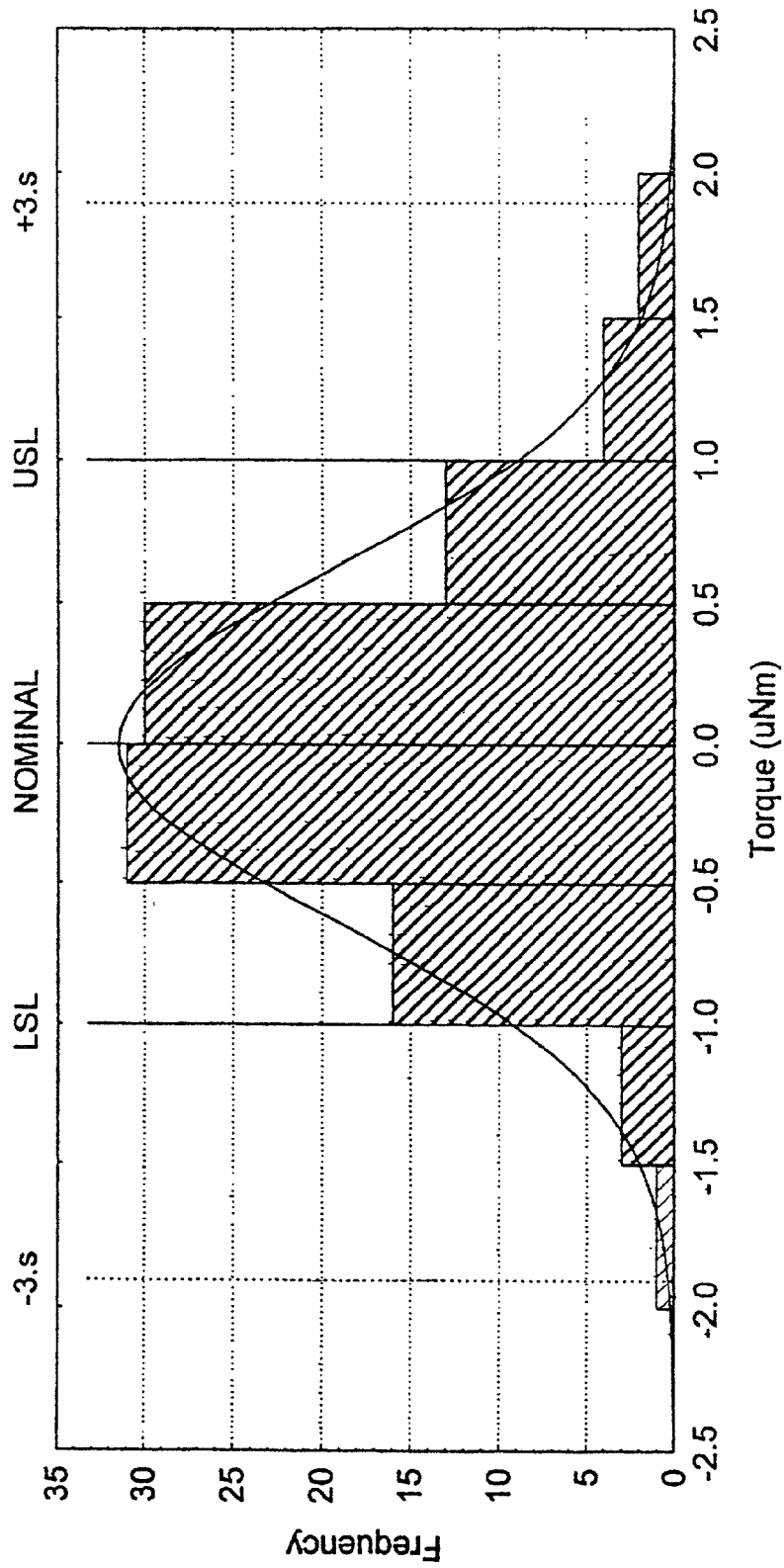
FIG. 17 is a histogram representing state of the art torque distributions without using this invention.
Figure 19:
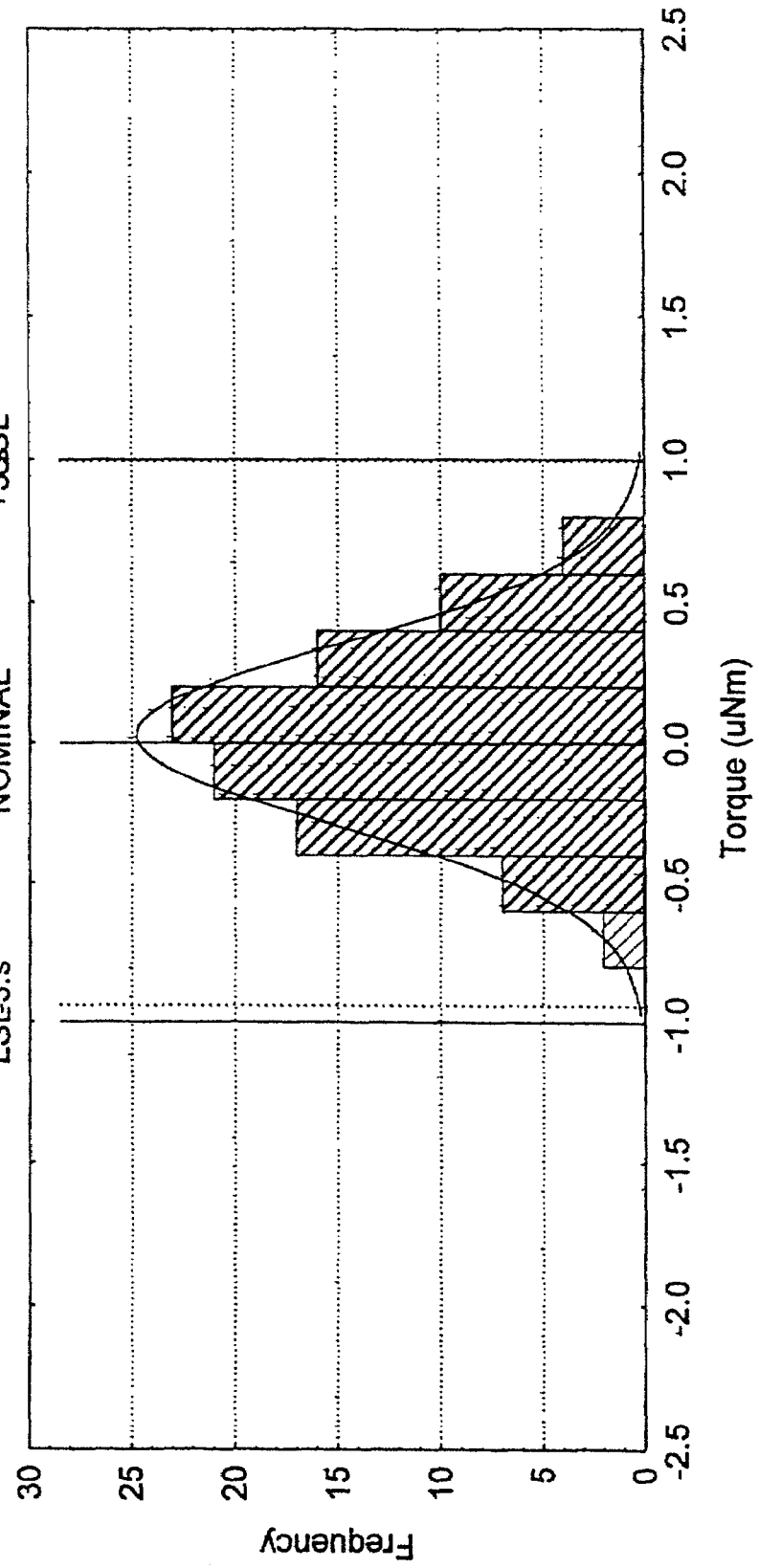
FIG. 19 is a histogram representing an improved torque distribution using this invention while directly measuring the suspension load position.
Figure 19:
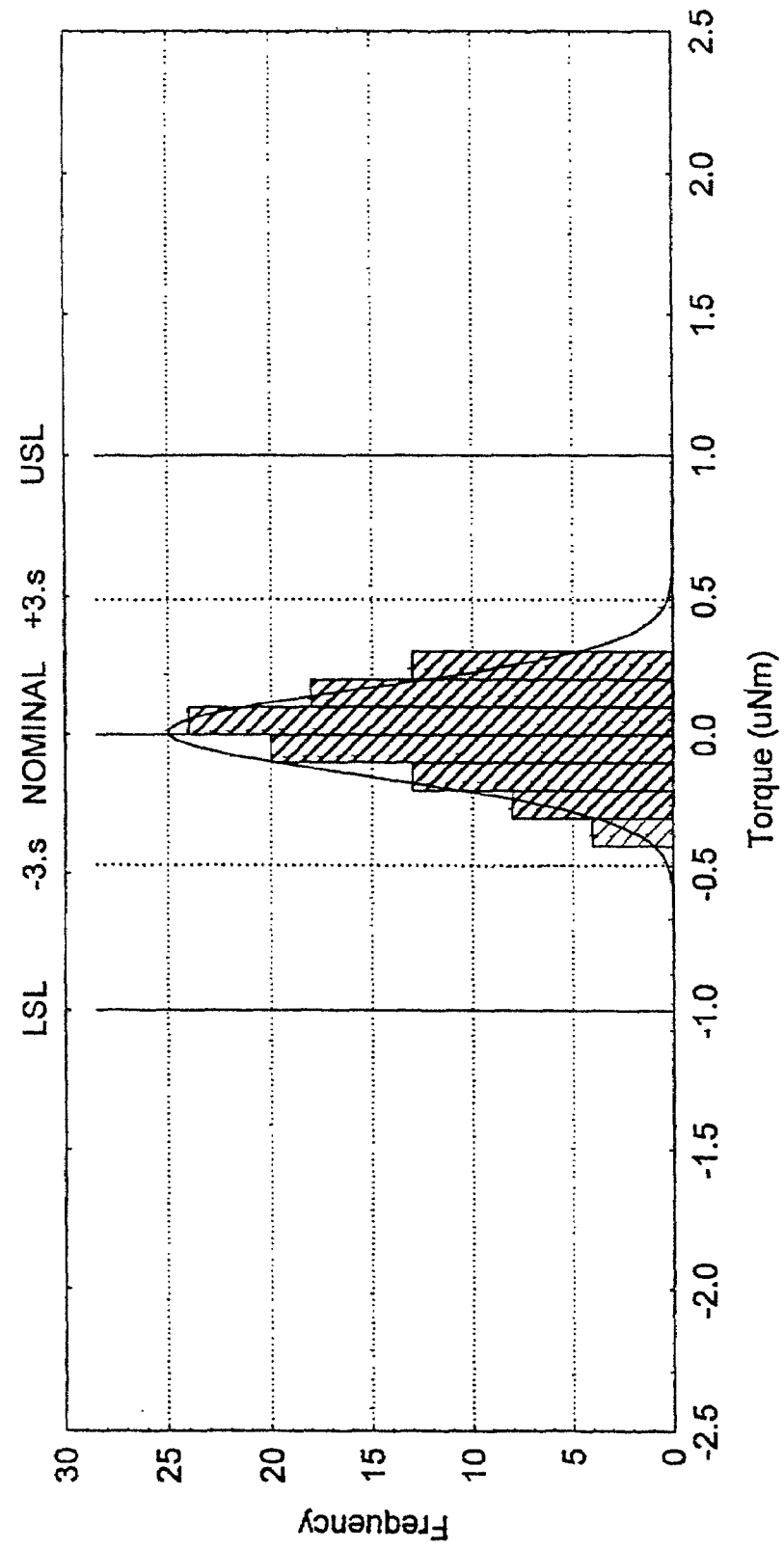

The model was generated using 100 random data points normally distributed within the assumed nominal +/−3 sigma limits of each variable listed above. Assuming a torque tolerance of 2 uNm (+/−1 μNm), FIG. 17 shows a torque histogram capability for today's standard, state of the art, process (sigma=0.63 μNm). FIG. 18 shows a 49% reduction in variation (0.32 μNm sigma) when the static angles of the suspension and circuited gimbal are taken into account for shifting the load point position to compensate the torque using the equation above to calculate the offset X. The variation is further reduced by 75% (0.16 μNm sigma) if load point measurement is improved from +/−30 μm to +/−15 μm as seen FIG. 19.

In the standard process of attaching the slider to the suspension, the datum features, namely the boss hole and tooling hole, of the suspension are used to predict the load point or dimple position. This method can yield a +/−30 μm error in position. It's expected that this error can be cut in half (to +/−15 μm) if suspension fiducials are utilized to optically locate the dimple. Furthermore, if a flexible circuit gimbal is utilized, meaning no stainless steel flexure is present, vision can be used to locate the dimple directly, whether it be a formed dimple or etched tower in the load beam, to further reduce the dimple position error.

While there may be additional steps in a head gimbal assembly process, such as cleaning, encapsulation, fly height measurement and others, the present disclosure only discusses process methods and techniques pertinent to the present invention.

While the above advantages are clearly present, other advantages are clearly anticipated. The preferred embodiments have been disclosed, but others are envisioned within the general scope of the inventions described herein.

he present invention having thus been described, other modifications, alterations, or substitutions may now suggest themselves to those skilled in the art, all of which are within the spirit and scope of the present invention. It is therefore intended that the present invention be limited only by the scope of the attached claims below.

What is claimed is:

1. A method of assembling a head gimbal assembly comprising the following steps performed in the following order:

attaching a head/slider having at least one termination pad to a flex circuit having at least one electrical lead to produce a head/slider circuited gimbal assembly having at least one static angle;

electrically connecting the at least one termination pad of the head/slider to the at least one electrical lead of the flex circuit;

attaching the head/slider circuited gimbal assembly to a suspension having at least one static angle; and determining the at least one static angle of the head/slider circuited gimbal assembly after the step of electrically connecting the at least one termination pad of the head/slider to the at least one electrical lead of the flex circuit.

2. The method of claim 1 and further including:
determining the at least one static angle of the suspension prior to the step of attaching the head/slider circuited gimbal assembly to the suspension.

3. The method of claim 2 and further including performing a dynamic electrical test on the head/slider circuited gimbal assembly prior to determining the at least one static angle of the suspension.

4. The method of claim 3 and further including determining an offset between the head/slider circuited gimbal assembly prior to attaching the head/slider circuited gimbal assembly to the suspension.

5. The method of claim 4 wherein said offset is determined according to the following formula:

$$X = -(\Theta_{Circuited\ Gimbal} * k_{Circuited\ Gimbal} + \Theta_{Suspension\ Flexure} * k_{Suspension\ Flexure})/F_{Gram} - X_0$$

where $\Theta_{Circuited\ Gimbal}$=static angle of the HSCG assembly;
$k_{(Circuited\ Gimbal)}$=stiffness of the HSCG assembly;
$\Theta_{Suspension\ Flexure}$=static angle of the suspension;
$k_{Suspension\ Flexure}$=stiffness of the suspension;
$F_{Gram}$=Gram Load; and
$X_0$=the product of the gram load and the load point shift.

6. The method of claim 1 and further including:
determining the at least one static angle of the suspension prior to the step of attaching the head/slider circuited gimbal assembly to the suspension.

7. The method of claim 1 and further including performing a dynamic electrical test on the head/slider circuited gimbal assembly prior to determining the at least one static angle of the suspension.

8. The method of claim 7 wherein said dynamic electrical test is performed by flying the head/slider circuited gimbal assembly over a rotating media disk.

9. The method of claim 1 and further including determining an offset between the head/slider circuited gimbal assembly prior to attaching the head/slider circuited gimbal assembly to the suspension.

10. The method of claim 9 wherein said offset is determined according to the following formula:

$$X = -(\Theta_{Circuited\ Gimbal} * k_{Circuited\ Gimbal} + \Theta_{Suspension\ Flexure} * k_{Suspension\ Flexure})/F_{Gram} - X_0$$

where $\Theta_{Circuited\ Gimbal}$=static angle of the HSCG assembly;
$k_{Circuited\ Gimbal}$=stiffness of the HSCG assembly;
$\Theta_{Suspension\ Flexure}$=static angle of the suspension;
$k_{Suspension\ Flexure}$=stiffness of the suspension;
$F_{Gram}$=Gram Load; and
$X_0$=the product of the gram load and the load point shift.

11. A method of assembling a head gimbal assembly comprising the following steps:
attaching a head/slider having at least one termination pad to a flex circuit having at least one electrical lead to produce a head/slider circuited gimbal assembly having a static angle;
electrically connecting the at least one termination pad of the head/slider to the at least one electrical lead of the flex circuit;
attaching the head/slider circuited gimbal assembly to a suspension having at least one static angle; and
determining the static angle of the head/slider circuited gimbal assembly prior to the step of attaching the head/slider circuited gimbal assembly to the suspension.

12. The method of claim 11 wherein the determining step comprises determining the static angle of the head/slider circuited gimbal assembly after the step of electrically connecting the at least one termination pad of the head/slider to the at least one electrical lead of the flex circuit, and further comprising the step of determining the static angle of the suspension prior to the step of attaching the head/slider circuited gimbal assemble to the suspension.

* * * * *